(12) United States Patent
Chaji et al.

(10) Patent No.: US 10,488,455 B2
(45) Date of Patent: Nov. 26, 2019

(54) MICRO DEVICE ARRANGEMENT IN DONOR SUBSTRATE

(71) Applicant: VueReal Inc., Waterloo (CA)

(72) Inventors: Gholamreza Chaji, Waterloo (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 15/724,320

(22) Filed: Oct. 4, 2017

(65) Prior Publication Data

US 2018/0095124 A1 Apr. 5, 2018

Related U.S. Application Data

(60) Provisional application No. 62/403,741, filed on Oct. 4, 2016, provisional application No. 62/426,353, filed (Continued)

(51) Int. Cl.
| | |
|---|---|
| *H01L 21/683* | (2006.01) |
| *G01R 31/26* | (2014.01) |
| *B41M 5/26* | (2006.01) |
| *H01L 23/00* | (2006.01) |
| *H01L 51/00* | (2006.01) |
| *H05K 1/11* | (2006.01) |

(Continued)

(52) U.S. Cl.
CPC ......... *G01R 31/2635* (2013.01); *B41M 5/265* (2013.01); *H01L 21/6835* (2013.01); *H01L 23/544* (2013.01); *H01L 24/27* (2013.01); *H01L 24/29* (2013.01); *H01L 24/32* (2013.01); *H01L 24/83* (2013.01); *H01L 51/0013* (2013.01); *H05K 1/111* (2013.01); *H05K 13/0015* (2013.01); *H01L 2221/68368* (2013.01); *H01L 2223/54426* (2013.01); *H01L 2224/97* (2013.01)

(58) Field of Classification Search
CPC ............... G01R 31/2635; H05K 1/111; H05K 13/0015; H01L 21/6835; H01L 24/83; H01L 51/0013; H01L 24/27; H01L 2224/97; H01L 24/29; H01L 24/32; B41M 5/265

See application file for complete search history.

(56) References Cited

U.S. PATENT DOCUMENTS

| | | |
|---|---|---|
| 6,132,909 A | 10/2000 | Phillips |
| 8,349,116 B1 | 1/2013 | Bibl |

(Continued)

FOREIGN PATENT DOCUMENTS

| | | | |
|---|---|---|---|
| WO | WO 97/36194 A1 | 10/1997 | |
| WO | WO 02/22374 A1 | 3/2002 | |
| WO | WO-2016100662 A1 * | 6/2016 | ......... H01L 25/0753 |

OTHER PUBLICATIONS

International Search Report and Written Opinion for International Application No. PCT/IB2017/056082, dated Jan. 30, 2018 (7 pages).

*Primary Examiner* — Matthew C Landau
*Assistant Examiner* — Dmitriy Yemelyanov
(74) *Attorney, Agent, or Firm* — Nixon Peabody LLP

(57) ABSTRACT

This disclosure is related to arranging micro devices in the donor substrate by either patterning or population so that there is no interfering with non-receiving pads and the non-interfering area in the donor substrate is maximized. This enables the transfer of micro devices to a receiver substrate with fewer steps.

14 Claims, 39 Drawing Sheets

Related U.S. Application Data on Nov. 25, 2016, provisional application No. 62/473,671, filed on Mar. 20, 2017, provisional application No. 62/482,899, filed on Apr. 7, 2017, provisional application No. 62/515,185, filed on Jun. 5, 2017.

(51) Int. Cl.
*H05K 13/00* (2006.01)
*H01L 23/544* (2006.01)

(56) References Cited

U.S. PATENT DOCUMENTS

2011/0151153 A1 6/2011 Felder
2017/0373046 A1* 12/2017 Gardner .............. H01L 25/0753

* cited by examiner

Average device performance

MICRO DEVICE ARRANGEMENT IN DONOR SUBSTRATE

CROSS-REFERENCE TO RELATED APPLICATION(S)

This application claims priority to and the benefit of U.S. Provisional Patent Application Ser. No. 62/403,741, filed Oct. 4, 2016, U.S. Provisional Patent Application Ser. No. 62/426,353, filed Nov. 25, 2016, U.S. Provisional Patent Application Ser. No. 62/473,671, filed Mar. 20, 2017, U.S. Provisional Patent Application Ser. No. 62/482,899, filed Apr. 7, 2017, and U.S. Provisional Patent Application Ser. No. 62/515,185, filed Jun. 5, 2017, each of which is hereby incorporated by reference herein in its entirety.

TECHNICAL FIELD

The present disclosure relates to a system for transferring micro devices onto a receiver substrate, and in particular to the patterning of micro devices on a donor substrate, and the landing area on a receiver substrate to increase the efficiency of transfer process.

BACKGROUND

Several different selective transfer processes have already been developed for micro devices. However, if the receiver substrate requires different micro devices that are part of different donor substrates, the extra devices on the other donor substrates may interfere with the locations (pads) assigned to other types of micro devices on the receiver substrate.

An object of the present invention is to overcome the shortcomings of the prior art by providing a particular patterning of devices on the donor substrate to avoid interference with pads on the receiver substrate destined for other micro devices. Other inventions comprises pre-processing the devices on a donor substrate (cartridge substrate), preparing the landing area (or pads) on a receiver substrate, transferring the micro devices from the donor to the receiver substrate, and post processing to enable device functionality. The pre-processing step may include patterning and adding bonding elements. The transfer process may involve bonding of a pre-selected array of micro devices to the receiver substrate followed by removing the donor substrate.

SUMMARY OF THE INVENTION

Accordingly, the present invention relates to a method of populating a receiver substrate, comprising:

a) providing a receiver substrate including a plurality of pixels, each pixel including first pads for receiving a first type of micro device and second pads for receiving a second type of micro device;

b) providing a first donor substrate including a plurality of the first type of micro devices arranged in arrays separated by first interfering areas void of the first type of micro devices;

c) aligning a first group of the first type of micro devices on the first donor substrate with a first group of the first pads on the receiver substrate, whereby the first interfering areas of the first donor substrate overlap the second pads to prevent interference with the second pads by the first type of micro devices;

d) transferring the first group of the first type of micro devices from the first donor substrate to the first group of the first pads of the receiver substrate;

e) adjusting a relative position of the first donor substrate and the receiver substrate to align a second group of the first type of micro devices with a second group of the first pads on the receiver substrate, whereby the first interfering areas of the first donor substrate overlap the second pads to prevent interference with the second pads by the first type of micro devices; and f) transferring the second group of the first type of micro devices from the first donor substrate to the second group of the first pads of the receiver substrate.

Another aspect of the present invention relates to a donor substrate comprising:

non-interfering areas including arrays of micro devices for transfer to receiver pads on a receiver substrate; and interfering areas comprising rows or columns of void areas for overlapping non-receiving pads on the receiver substrate to prevent micro devices on the donor substrate from interfering with non-receiving pads during transfer of micro devices to the receiving pads.

Another feature of the present invention provides a method of arranging micro devices on a donor substrate to avoid interference with non-receiving pads on a receiver substrate during transfer of micro devices from the donor substrate to receiving pads on the receiver substrate, comprising:

a) determining interfering areas on the donor substrate by
i) determining areas on the donor substrate that overlap non-receiving pads on the receiver substrate during transfer of a first micro device to a first receiving pad on the receiver substrate; and
ii) determining areas on the donor substrate that will not overlap non-receiving pads after offsetting at least one of the donor or the receiver substrate relative to the other to align at least a second micro device with a second receiving pad on the receiver substrate or another receiver substrate after the first micro device has been transferred to the receiver substrate; and b) arranging micro devices on the donor substrate in non-interfering areas other than the interfering areas.

Another aspect of the present invention relates to a method of populating a receiver substrate, comprising:

a) providing a receiver substrate including a plurality of pixels, each pixel including first pads for receiving a first type of micro device and second pads for receiving a second type of micro device;

b) providing a first donor cartridge substrate including a plurality of the first type of micro devices arranged in arrays, and a plurality of the second type of micro devices arranged in arrays, interleaved with the arrays of the first types of micro device separated by a first interfering area void of the first or second types of micro devices;

c) aligning a first group of the first types of micro devices and a first group of the second types of micro devices on the first donor cartridge substrate with a first group of the first pads and a second group of pads, respectively, on the receiver substrate, whereby the first interfering area of the first donor cartridge substrate overlap an area caused by a difference in pitch between the pads and the pixels;

d) transferring the first group of the first and second types of micro devices from the first donor cartridge substrate to the first group of the first and second pads of the receiver substrate;

e) adjusting a relative position of the first donor cartridge substrate and the receiver substrate to align a second group of the first and second types of micro devices with a second group of the first and second pads on the receiver substrate, whereby the first interfering areas of the first donor substrate overlap an area caused by a difference in pitch between the pads and the pixels; and f) transferring the second group of the first and second types of micro devices from the first donor substrate to the second group of the first and second pads of the receiver substrate.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
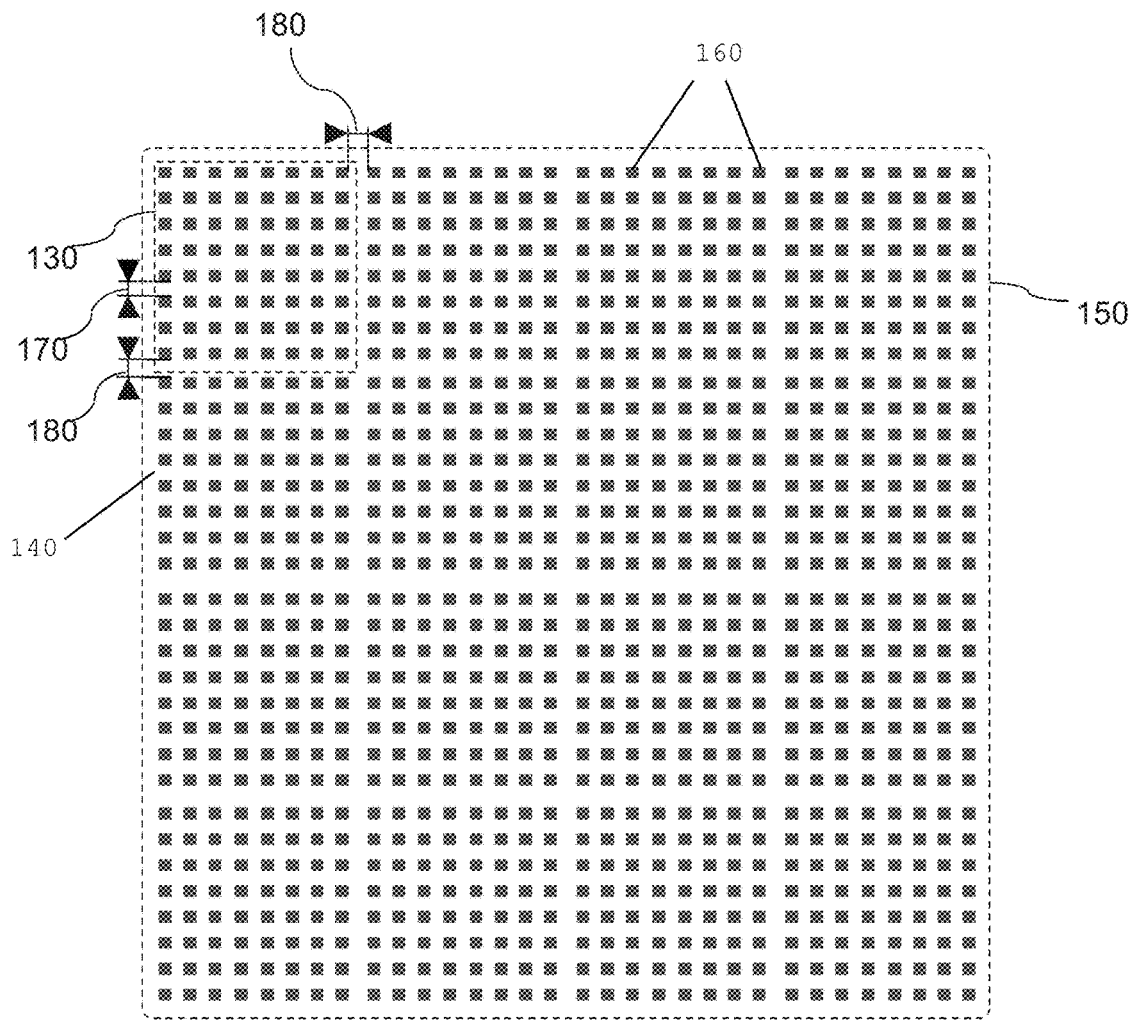
FIG. 1 illustrates an example of a micro device arrangement in a donor substrate.

While the present teachings are described in conjunction with various embodiments and examples, it is not intended that the present teachings be limited to such embodiments.

On the contrary, the present teachings encompass various alternatives and equivalents, as will be appreciated by those of skill in the art.

In this disclosure, a pad on a receiver substrate refers to a designated area on the receiver substrate where a micro device has been or will be transferred from a donor substrate. The pads could be conductive to provide a connection between the micro device and a pixel circuit or the connections to the pixel circuits may be underneath the pad or on the side of the pad. The pad may have some form of bonding materials to hold the micro device permanently. The pad may be a multi-layer stack to offer a more mechanically stable structure, and also to provide better functionality, such as bonding and conductivity capability.

The pads in this description may provide at least one of an electrical connection, a mechanical connection, and a defined area for transferring micro devices. The shapes of the pads used in the illustrated embodiments are for the purpose of illustration only, and the pads may have any arbitrary shape. The position of the pads with respect to the pixels may be changed without any effect on the embodiments. The orientation of the group of pads in the pixel may be changed. For example, they may be rotated, shifted or moved to different positions. The pads may have a complex structure comprising different conductive, semiconductor and dielectric layers. The pads may be positioned on top of other structures, such as transistors, in the receiver substrate. Also, the pads may be beside other structures on the receiver substrates.

The shape of the micro devices used in the embodiments are for purpose of illustration, and the micro devices may have different shapes. The micro devices may have one or more pads on the side that will contact the receiver substrate. The pads may provide mechanical or electrical connection or a combination of both.

In one embodiment, a method of arranging micro devices in the donor substrate is described that is used to transfer micro devices to the receiver substrate. In the donor substrate, micro devices are arranged in relation to the pixel area, and within the area associated with the pixel the micro devices may have a pitch that is smaller than the pixel pitch.

In this arrangement, the pitch between the micro devices at the boundary of two pixels may be different from the pitch of micro devices within the pixel.

In this case, there are more micro devices on the donor substrate than intended/wanted pads in the receiver substrate associated with the donor substrate area. Therefore, the micro devices may interfere with other unwanted/unintended pads in the receiver substrate. Several embodiments in this document are described to define interfering areas of the donor substrate to either remove or not populate micro devices in those areas. This embodiment may be used for different micro device arrangements in the donor substrate.

In another embodiment, a method of arranging micro devices described in a donor substrate to avoid interference with unwanted pads, includes
  a) defining interfering areas or non-interfering areas where:
  1) the non-interfering areas are spaces in the donor substrate that are not covered by other unwanted pads during micro device transfer to receiver substrate, i.e. the interfering areas are covered by unwanted pads, OR
  2) will not be covered by pads after offsetting the donor or receiver substrate in a certain direction to align at least one micro device with a wanted pad in the receiver substrate after at least one micro device different from said micro device is transferred to a pad different from the said pad in the receiver substrate, i.e. the interfering areas will be covered by pads in subsequent steps; and
  b) arranging micro devices in the non-interfering areas of the donor substrate.

In the receiver substrate described above, one pad on the receiver substrate may have a taller structure, and the micro device associated with the pad may have a shorter structure. Thus, there will be no interfering area for this pad.

To increase the non-interfering area, one embodiment comprises a method of arranging the pads associated with the micro device transfer position in the receiver substrate into clusters, wherein within said clusters the pad pitch is smaller than the sub-pixel pitch.

In case of cluster pads, a donor substrate for a pad at the edge of a cluster may be arranged in such way that interfering and non-interfering areas are similar to the pixel area where the width of the interfering area is the same as the distance of the other pads from the pad.

In case of a cluster, a donor substrate for a pad inside of the cluster may be arranged, whereby interfering and non-interfering areas are similar to the pixel area, and the interfering areas are defined by:
  a) Finding the distance between the pad and the edge of the cluster;
  b) Picking one micro device as a reference device on the donor substrate;
  c) Defining the interfering area from the micro device on both sides similar to the distance of the associated pads to the edge of the cluster.

The pattern of interfering and non-interfering areas, defined by an area associated with a pixel on the donor substrate, may be repeated on the donor substrate similar to the pixel pitch.

In the remaining area of the donor substrate, patterned (arranged) for the middle pad, associated with each pixel, a column (or row) of micro devices is between interfering areas whose width is larger than the minimum distance of the middle micro device from the edge of said cluster.

In one embodiment to maximize the non-interfering area, the pad pitch within the cluster may be the same as the micro device pitch in the donor substrate.

In another embodiment to maximize the non-interfering area, the pads may be arranged in a two-dimensional cluster. The pads in the cluster may be aligned with at least another pad.

In one embodiment, a donor substrate for the pads may be aligned with other pads in two directions, creating diagonal interfering areas with reference to the pad cluster orientations. The area may contain other pads and the remaining area associated with a pixel is non-interfering, in which micro device may exist.

In another embodiment, a donor substrate for the pads may be aligned with pads in only one direction, which has the interfering area as:

One row including other pads if the said pad is aligned vertically with the other pads, OR One column if the said pad is aligned horizontally with another pad.

Whereby, the remaining area associated with a pixel is non-interfering in which a micro device can exist.

In this embodiment, donor substrate, and/or cartridge substrate are used interchangeably. The characteristics of the donor substrate can be applied to the cartridge and vice versa.

Figure 2:
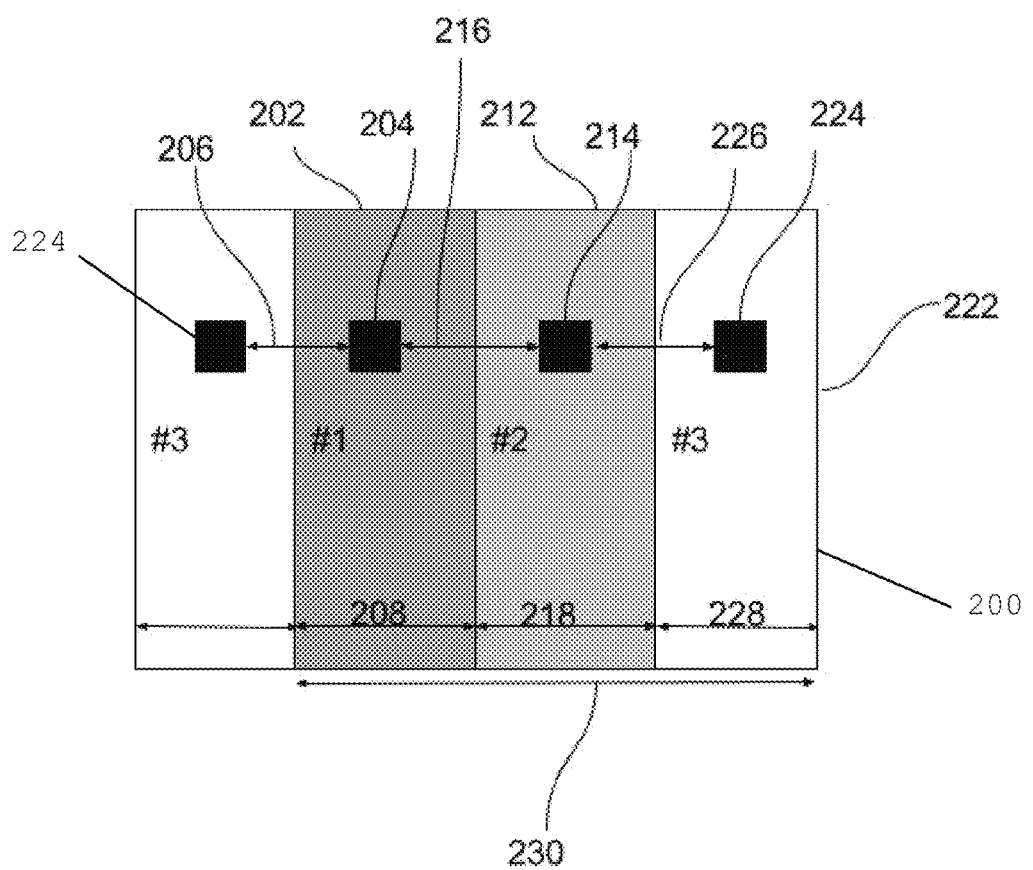
FIG. 2 illustrates an example of a receiver substrate pixel with three different sub pixels.

FIG. 1 illustrates a donor substrate 150, in which there are more micro devices 160 than associated pads in a receiver substrate, e.g. see FIGS. 2 and 3. In this case, the micro devices 160 may have a pitch 170 smaller than a pixel pitch of the receiver substrate in an area or block 130 of the donor substrate associated with the pixels. Also, as the pixel pitch may not be a multiple of the micro device pitch 170, the micro device pitch 180 between two adjacent (vertically and horizontally) pixel areas 130 and 140 may have a different pitch, e.g. a void or interference area, to accommodate the difference between the pixel and micro device pitches.

In traditional pick and place, the micro devices 160 on the transfer head, e.g. donor substrate 150, are transferred one at a time or one row at a time to a position on the receiver substrate. To populate the rest of the receiver substrate or another receiver substrate, the transfer head needs to be repopulated or a new donor substrate 150 must be used. This process requires fast and accurate movement and precision alignment every time to avoid the interference of the micro devices 160 on the donor substrate 150 with other micro devices 160 already on the receiver substrate or other pads on the receiver substrate not destined to receive that particular micro device 160. However, the present invention enables more micro devices 160 to be disposed on the donor substrate 150 than what is required to populate an equivalent area on the receiver substrate, thereby minimizing repopulation steps. Accordingly, empty or void areas on the donor substrate 150 enable the donor substrate 150 (or receiver substrate) to be offset during the transfer process to align the remaining set of micro devices 160 with corresponding locations in the receiver substrate. The offset can be done independently or it can be part of moving the donor substrate 150 to the new location on the receiver substrate or a new receiver substrate.

FIG. 2 illustrates a pixel structure in a receiver substrate 200. An array of pixels on the receiver substrate 200 may be made of different orientations and combinations of this pixel structure. The pixel structure comprises different micro devices and each micro device may have a different pixel circuit or pixel connections. The pads 204, 214, 224 for each micro-device type are put in each designated subpixel area 202, 212, 222, with a width of 208, 218 and 228, respectively, and repeated in both x and y directions forming an array of pixels. In the illustrated embodiment, the receiver substrate 200 includes three different pads 204, 214, 224 for three different micro devices at a distance of 216 and 226 apart. However, one can use any number of different micro devices. In one pixel array structure, the micro device types (or subpixel type) only vary in one direction (one-directional array structure). In another array type, the micro devices can vary in two or more directions (two-directional array). If the donor substrate 150 for each device type has micro devices 160 in all areas, i.e. a completely filled 2×2 array, the micro devices 160, in corresponding areas to the pads 204, 214 and 224 of the other micro device types, may interfere with the pads 204, 214 and 224 during the transfer process. In one case, only the micro devices 160 in the area related to the corresponding pads, e.g. 204, on the receiver substrate 200, remain on the donor substrate 150. However, in this case the donor substrate 150 needs to be replaced or refilled after each transfer, which can increase the processing steps. Moreover, the micro device utilization may be affected, if the reset of micro devices 160 cannot be used. In one aspect of the invention, the donor substrate 150 for each micro device 160 is divided into interfering and non-interfering areas. The micro devices 160 from the interfering areas of the donor substrate 150 are removed or not populated. In one aspect of this invention, the micro devices 160 are arranged in a donor substrate 150 to avoid interfering with unwanted pads, e.g. 214 and 224, where the method includes:

a) defining non-interfering areas as:

i) spaces in the donor substrate 150 that do not correspond with, overlap or interfere with other unwanted pads 204, 214, 224 on the receiver substrate 200 during transfer of a first set of the micro devices 160 to a first set of the pads 204 on the receiver substrate 200; and ii) spaces in the donor substrate 150 that do not correspond with, overlap or interfere with the pads 204, 214 and 224 after offsetting the donor or the receiver substrates 150 or 200, respectively, in a certain direction to align a second set of the micro device 160 with a second set of the wanted pad 204, 214 and 224 in the receiver substrate 200 after at least the first set of the micro devices 160 different from the second set of the micro devices 160 is transferred to the second set of pads 214 or 224 different from the first set of pads 204 in the receiver substrate 200; and b) arrange the micro devices 160 only in the non-interfering areas of the donor substrate 150.

Alternatively, the method may include:

a) defining interfering areas as:

i) spaces in the donor substrate 150 that correspond with, overlap or interfere with other unwanted pads 204, 214, 224 on the receiver substrate 200 during transfer of a first set of the micro devices 160 to a first set of the pads 204 on the receiver substrate 200; and ii) spaces in the donor substrate 150 that correspond with, overlap or interfere with the pads 204, 214 and 224 after offsetting the donor or the receiver substrates 150 or 200, respectively, in a certain direction to align a second set of the micro device 160 with a second set of the wanted pad 204, 214 and 224 in the receiver substrate 200 or a different receiver substrate after at least the first set of the micro devices 160 different from the second set of the micro devices 160 is transferred to the second set of pads 214 or 224 different from the first set of pads 204 in the receiver substrate 200; and b) arrange the micro devices 160 only in the non-interfering areas of the donor substrate 150, but not the interfering areas.

In one way to define the non-interfering areas, the directions of an offsetting donor substrate 150 (or the receiver substrate 200) in relation to the receiver substrate 200 (or the donor substrate 150) are defined. For example, after a first set of the micro devices 160 are transferred from the donor substrate 150 to the first set of pads 204, the donor substrate 150 is offset horizontally and vertically. After transferring the first set of micro devices 160 from the donor substrate 150 to the receiver substrate 200, the donor substrate 150 is either offset horizontally or vertically. The other set of micro devices 160 may be aligned with other related pads 214 or 224, and transferred to these pads on the receiver substrate 200 that can be the original receiver substrate 200 or a different one. The following procedure is an exemplary process that can be used to identify the interfering and non-interfering area.

a) A first set of micro devices for transferring to the receiver substrate is used as a reference.

b) From the reference micro devices, draw lines in parallel with the offsetting direction.

c) Draw lines in the direction of offsets from the corresponding pads for other type of micro devices in reference to the reference pads on the donor substrate.

d) Identify the closest lines from the other types of micro devices to the lines of the micro device on the donor substrate.

e) Draw a line between the selected lines and the micro device line. This line has a similar distance from each of the micro device line and selected lines.

f) The areas defined by the new lines and encompassing the micro device are the non-interfering areas. The other areas are defined as interfering areas.

Figure 3A:
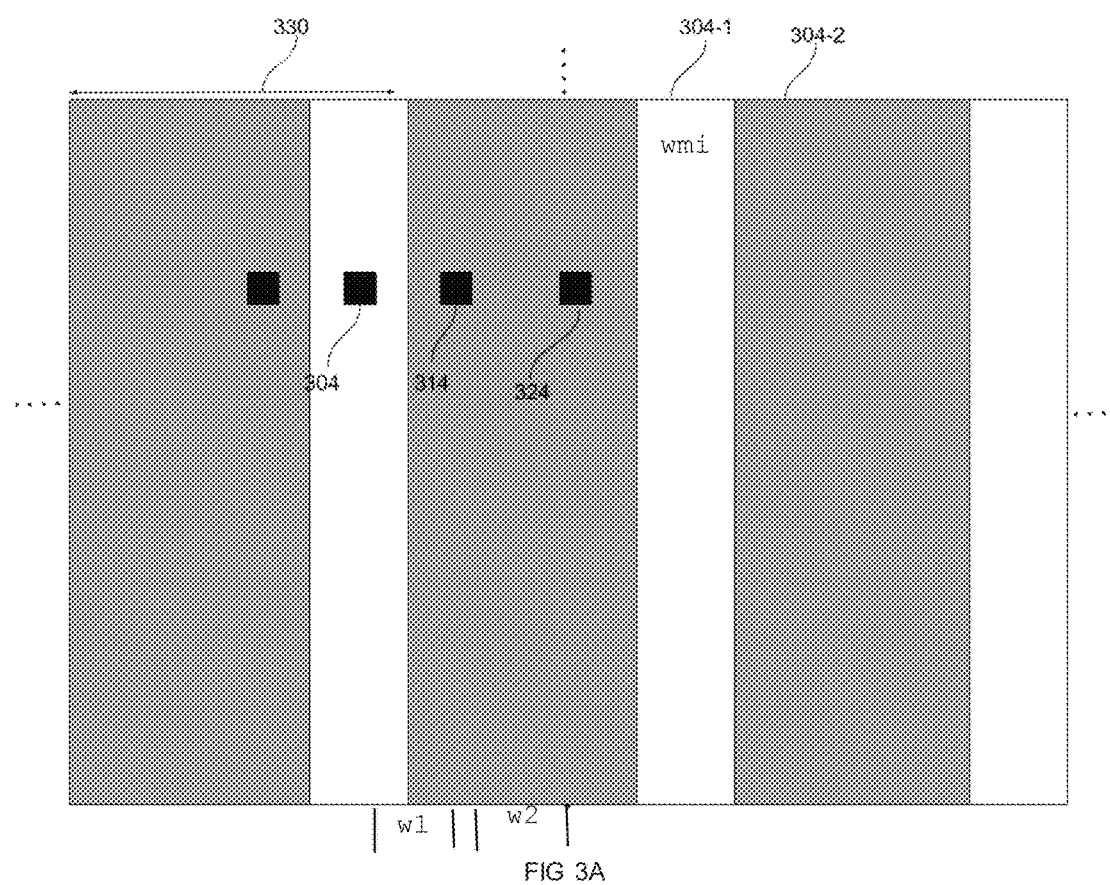
FIG. 3A illustrates an embodiment of a donor substrate arranged into interference and non-interference areas based on the receiver substrate.
Figure 3B:
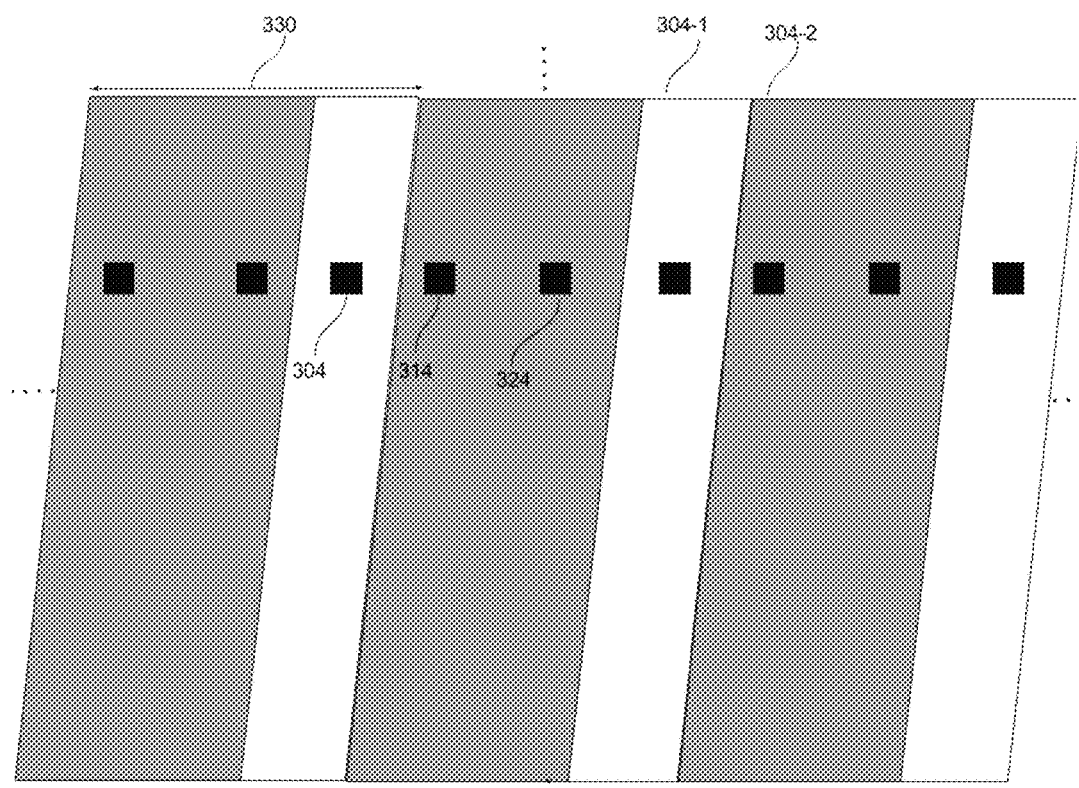
FIG. 3B illustrates another embodiment of a donor substrate arranged into interference and non-interference areas based on the receiver substrate.

FIG. 3A shows one example of defining non-interfering area 304-1 and interfering area 304-2. The pixel area 330 includes both non-interfering and interfering areas 304-1 and 304-2, respectively. In this case, the micro devices are offset horizontally and vertically. As a result, the width $w_{ni}$ of the non-interfering area 304-1 for each micro device is half of the sum of the distances $w_1$ and $w_2$ between the pad 304 for that micro device and the other adjacent pads 314, 324, respectively. In FIG. 3B, the devices are offset horizontally and diagonally. As a result, the non-interfering area 304-1 has a slope similar to the slope of a diagonal offset process. As can be seen in both cases, the non-interfering area 304-1 is small compared to the interfering area 304-2.

Figure 4:
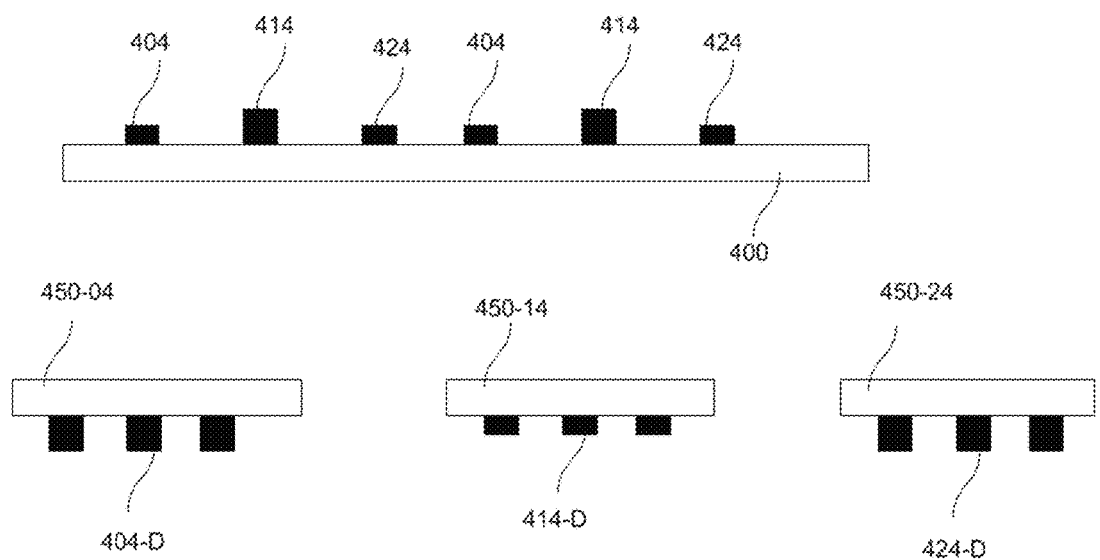
FIG. 4 illustrates an embodiment using a taller pad associated with one of the microdevices to improve the non-interfering area.

One solution to address this issue is to have one of the pads 414 taller than at least one of the other pads 404, 424. The micro device 414-D with the taller pad 414 may be the more expensive device or more used on the receiver substrate 400. However, it can be any other device as well. In the illustrated embodiment, the other micro devices 404-D and 424-D may have a taller structure compared to the micro devices 414-D associated with the taller pads 414, whereby the resulting combination of pad 414 and device 414-D heights are substantially the same as those of pad 404 and device 404-D. One method to achieve a taller device is to have taller connection pads. The taller pad may be on either side of the device. FIG. 4 shows an exemplary receiver substrate 400 in which one or more pads 414 are taller than the other pads 404, 424. In the illustrated embodiment, three different micro devices 404-D, 414-D, 424-D are being transferred to the receiver substrate 400 from donor substrates 450-04, 450-14, 450-24, respectively. The micro devices 404-D and 424-D, associated with the shorter pad structures 404 and 424, have taller structures compared to the other micro device 414-D. The same technique can be applied to other combination of micro devices (more or less than three micro devices). Accordingly, the shorter micro devices 414-D will not interfere with the shorter pads 404 and 424, and the interfering area on the donor substrate 450-14 is minimal.

Figure 5:
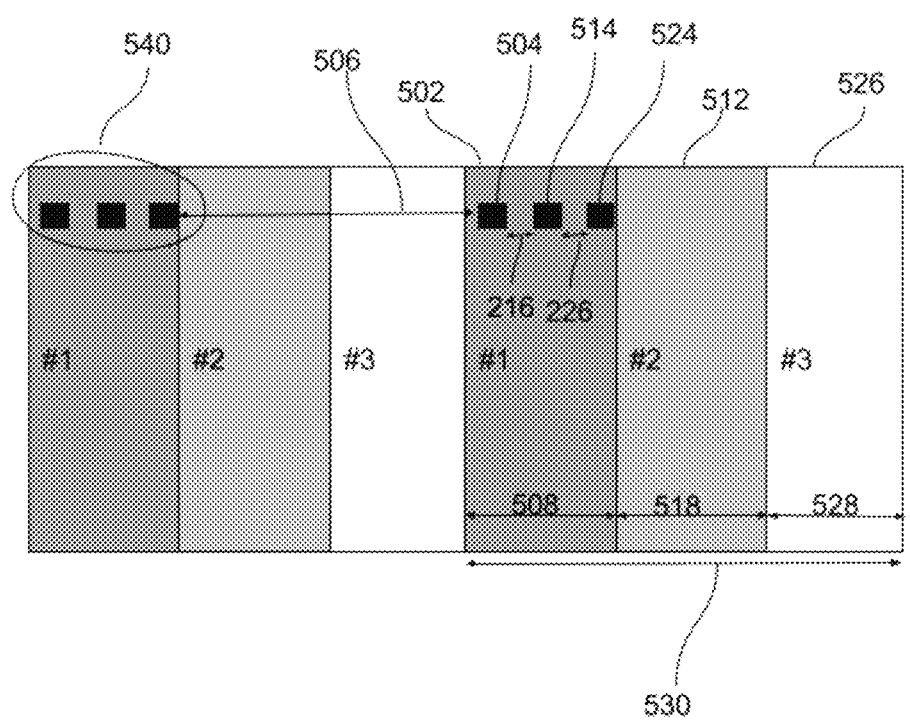
FIG. 5 illustrates a cluster pad embodiment to improve the non-interfering area.

In another solution, the pads 504, 514 and 524 for different micro devices may be set in a cluster 540 close to each other, leaving a large area or pitch between clusters. In one embodiment, the circuit or other connections associated with the pads 504, 514 and 524 may be defined by sub-pixel structures #1, #2 and #3 with widths 508, 518 and 528, respectively, for ease of implementation. In another embodiment, the circuits and connections may have any other structure. The closer the pads 504, 514 and 524 are together, the larger the non-interfering area 506 will be. In one case, the distance between two pads, e.g. 216 or 226, can be equal to or smaller than ⅓ of the pixel pitch 530 for three different micro devices (three different sub-pixels) on the donor substrate. For more or fewer sub-pixels (micro device types) similarly the pads 504, 514 and 524 may be put closer together. In one embodiment, the distances 216 and 226 between the pads 504, 514 and 524 in the cluster 540 is similar to the micro device pitch on the donor or cartridge substrate. If the different micro devices have the same pitch on the donor substrates, the cluster pads 504, 514 and 524 will have the same pitch. In another case, the distance between the pads 504, 514 and 524 in the cluster 540 is a multiple (for example twice that) of the pitch of micro devices on the donor substrate. In another embodiment, the distance between the pads can be smaller than the pitch of micro devices on the donor substrate. FIG. 5 shows a receiver substrate with an example of pad clusters 540. These pads 504 514, 524 may be from the sub-pixels 502, 512, 526 in one pixel 530 or from different pixels. The pads 504, 514, 524 may be in any position with reference to the pixel 530. It is possible that the order and position of the pads 504, 514, 524 are different for different pixels.

Figure 6A:
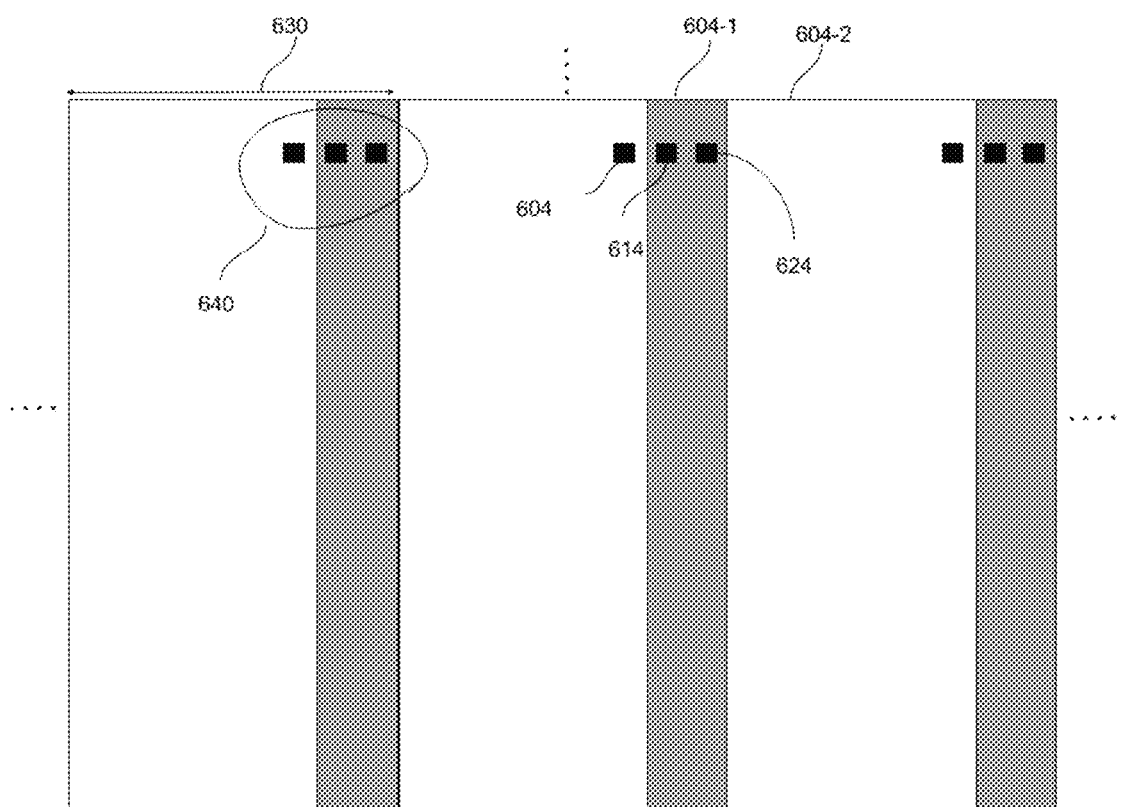
FIG. 6A illustrates an embodiment of a donor substrate with a non-interfering area associated with the pads at the edge of cluster pads.
Figure 6B:
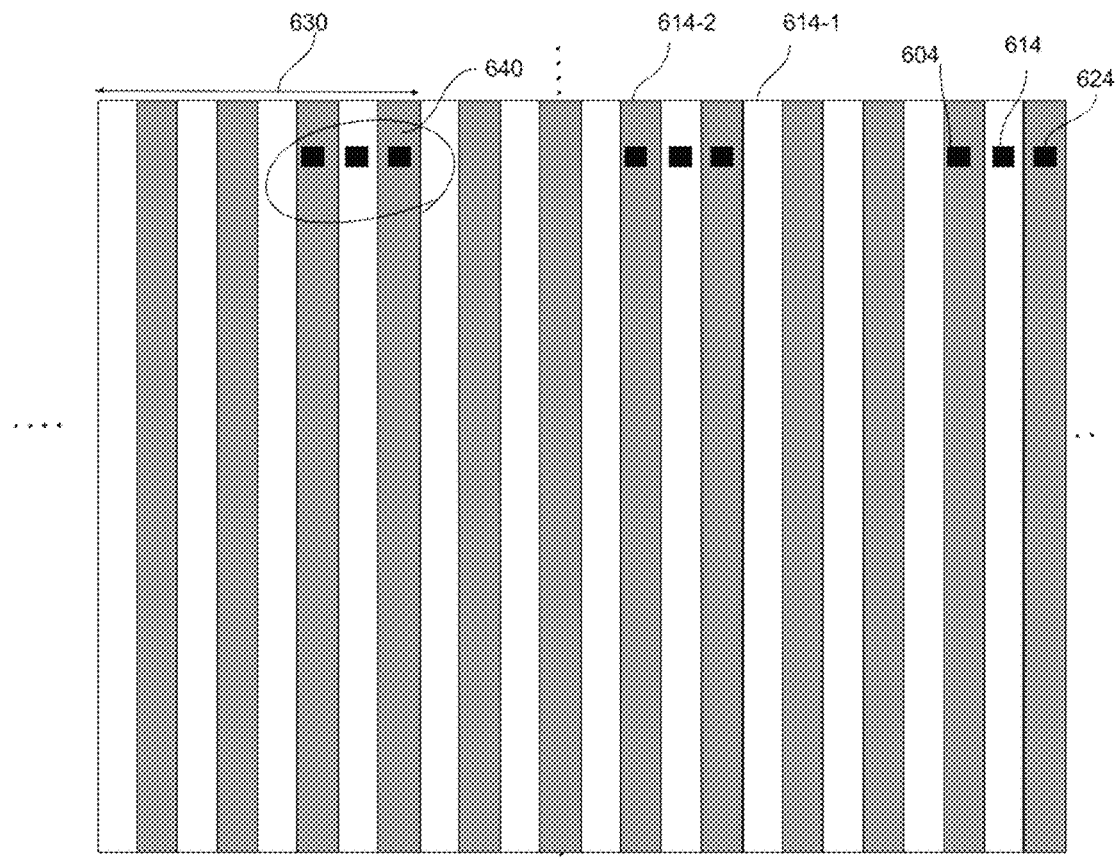
FIG. 6B illustrates a donor substrate embodiment with a non-interfering area associated with the inside pads of the cluster.

FIG. 6A shows the interfering area 604-1, and the non-interfering 604-2 area for the pad 604 at the edge of the cluster 640. The same structure can be used for the other pad 624 at the other side of the cluster 640. As can be seen the non-interfering areas 604-2 for the pads 604 and 624 at the edge of the cluster 640 are larger compared to previous cases. For the pad 614 in the middle, the non-interfering area 614-1 and interfering area 614-2 can be a stripe pattern as demonstrated in FIG. 6B. Here, the width of the stripe is the same as the distance between the middle pad 614 and the other pads 604 and 624. To define the non-interfering areas, following steps can be used:

a) Find the distance between the pad 604 and the edge of the cluster pad b) Pick one micro device as a reference device in the donor substrate c) Interfering area is defined from the micro device to both sides similar to the distance of the associated pads to the edge of cluster.

The pattern of interfering and non-interfering areas defined by an area associated with a pixel in the donor substrate can be repeated in the donor substrate similar to the pixel pitch. In the remaining areas of the donor substrate, patterned (arranged) for the middle pad, associated with each pixel, a column (or row) of micro devices is between interfering areas whose width is larger than the minimum distance of the middle micro device from the edge of said cluster. If the distance between the middle pad and the other pads is the same, the ratio of interfering area 614-2 to non-interfering area 614-1 may be the same. Similar to FIG. 3B, the interfering and non-interfering areas 614-2 and 614-1 may have different shapes depending on the offsetting direction. Also, similar to FIG. 4, the middle pad can be taller and so in this case the non-interfering area for the middle micro device can be the entire donor substrate.

If the micro devices do not have a similar pitch, the distance between pads 604, 614 and 624 in the cluster 640 can be similar to any of the pitch of the micro devices or each pad 604, 614 and 624 may have different distance from the other pads. To improve the non-interfering area, the middle device may be the one with the larger pitch, whereby using taller pads can help to improve the interfering area.

Figure 7A:
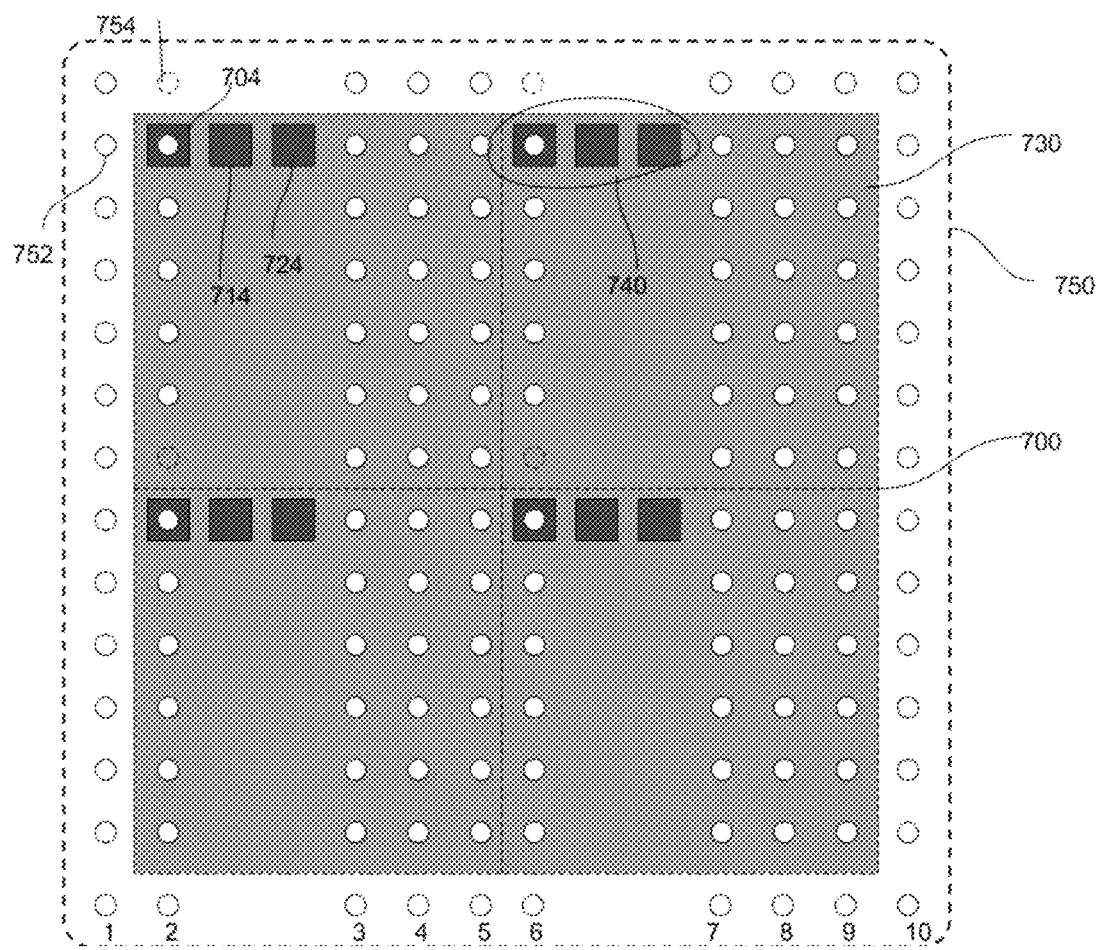
FIG. 7A illustrates an example of a donor substrate and a receiver substrate with cluster pads.

FIG. 7A illustrates an embodiment in which pads 704, 714 and 724 in a receiver substrate 700 have the same pitch as micro devices 752 and 754 in a donor substrate 750. The position of a pad cluster 740 may be different with reference to the pixels 730 on the receiver substrate 700. The size of the pads 704, 714 and 724 may be smaller than, similar to, or larger than the micro devices 752 and 754. The shape of the micro devices 752 and 754 and the pads 704, 714 and 724 may be any suitable shape and size. In this case, the micro devices 752 and 754 may be removed (or nonpopulated) from the interfering area on the donor substrate 750 creating void areas on the donor substrate 750 corresponding to current or future populated or unpopulated pads on the receiver substrate 700 and any subsequent receiver substrate, which are not designated to receive one of the micro-devices from the current donor substrate 750.

FIG. 7A illustrates an embodiment for the edge pad 704 (similar structure can be used for 724). In the illustrated embodiment, the donor substrate 750 includes arrays of micro-devices 752 separated by void areas, each with at least a width substantially equal to the sum of the pitches of the adjacent pads, e.g. pad 704 to 714 and pad 714 to 724, of the pitch×N (the number of adjacent pads) for equally spaced pads. The minimum distance for the void areas, i.e. the distance between arrays of micro devices 752 on the donor substrate 750, is the distance from one side of the pad closest to the pad being filled, e.g. pad 714, to the opposite side of pad farthest from the pad being filled, e.g. pad 724. In other words, the area to cover the other pads 714 and 724 without interfering therewith during a current or any future transfer steps. The donor substrate 750 may be comprised of columns and rows of micro devices 752 and 754, and include void areas defined by a number of missing columns or rows equal to the number of pads, e.g. 714 and 724, adjacent to the receiver pad, e.g. 704, on each side thereof. The number of columns in each array is dependent upon the spacing between the pads 704 and 724 in adjacent pixels 730. For example, the donor substrate 750 for the pad 704, which includes two adjacent pads 714 and 724 to the right and none to the left, may include a void area with two missing columns of micro devices, if the pitch of the micro devices 752 and 754 is the same as the pads 714 and 724. Alternatively, if the pitches are different, then the void area may be at least the distance from the pad, e.g. pad 704, mounted to the far edge of the farthest pad, e.g. pad 724.

Some of the micro devices 754 may have already been transferred to the receiver substrate 700, and the donor substrate 750 (or the receiver substrate 700) is offset vertically and/or horizontally with reference to the next receiver substrate 700 (or donor substrate 750), so that another micro device 754 is aligned with one of the bare pads 704 (pads to which no micro device is transferred). In this case, the empty space created by transferring the micro device 754 will be a new empty area which will be on top of the pad 714, and the empty space that was on top of the pad 714 will be on top of the pad 724, when the receiver substrate 700 (or donor substrate 750) is subsequently offset again. As such there will be no interference caused by the micro devices 752 and 754 for the unwanted pads 714 and 724. One can finish all the micro devices in one column by offsetting vertically first and then moving to the next column (for example, after finishing column 2, moving to column 1). However, other combinations of vertical and horizontal offsetting can be used. The pixels 730 or the pad clusters 740 may be at an angle either vertically or horizontally. In this case, the rows or columns of micro devices will be tilted as well. In addition, the micro devices can be at an angle without the pads or pixels being at angles. In this case, the offsetting direction will be toward the angle of the column or the row.

Figure 7B:
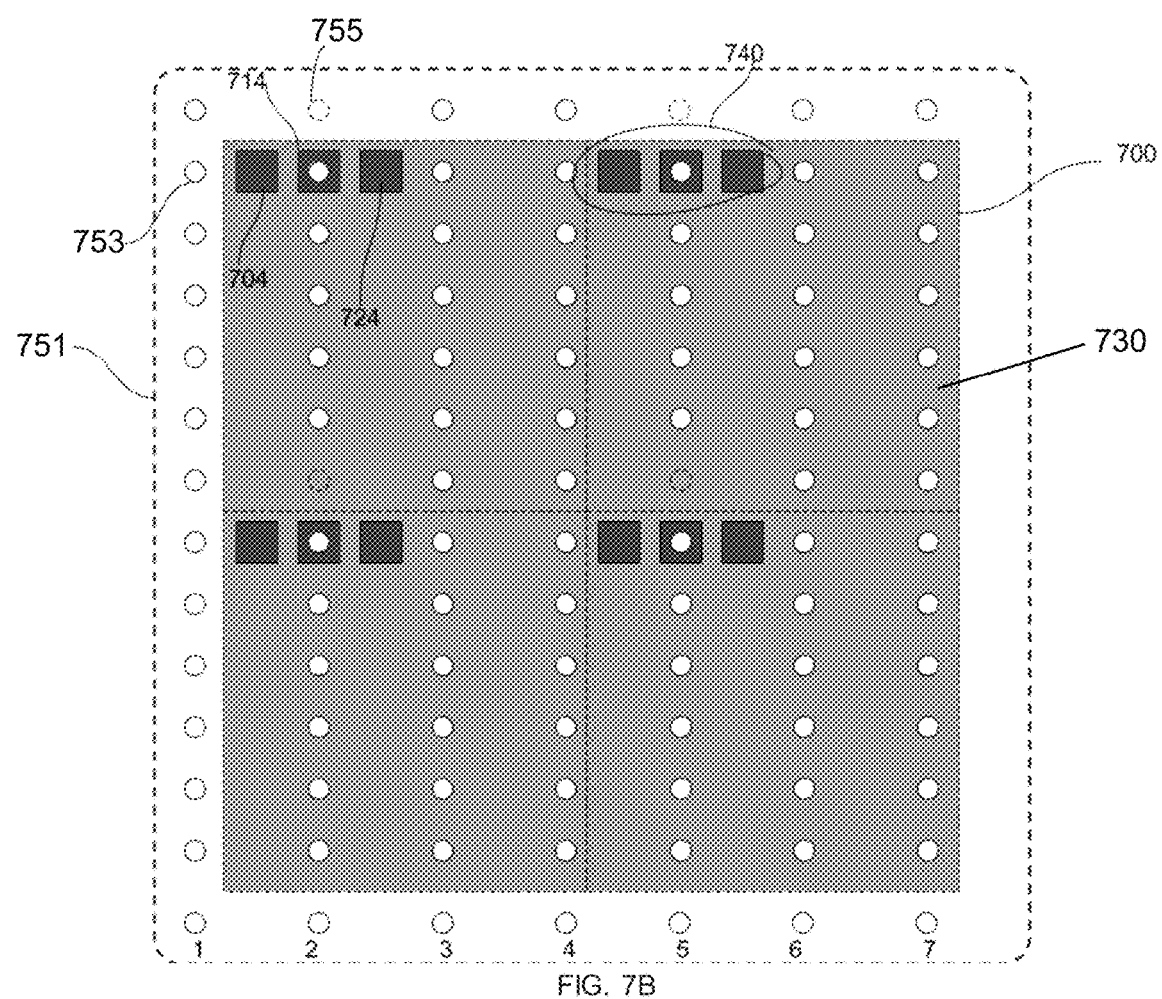
FIG. 7B illustrates another example of a donor substrate and a receiver substrate with cluster pads.

FIG. 7B shows a similar structure for a donor substrate 751, as above, but for the middle pad 714, which would be aligned with the receiver substrate 700 before or after the donor substrate 750. In the illustrated embodiment, the arrays, e.g. 1×N array, of micro devices 753 and 755 are separated by void areas each with a width substantially equal to the sum of the pitches of the adjacent pads, e.g. 704 and 724, e.g. the pitch×N (N=the number of adjacent pads) for equally spaced pads. The minimum distance for the void areas, i.e. the distance between arrays of micro devices 753 on the donor substrate 751, is the distance from one side of the pad closest to the pad being filled, e.g. pad 704 or 724, to the opposite side of the pad farthest from the pad being filled, e.g. the same pad 704 or 724. In other words, the void areas have enough space, i.e. distance between arrays of micro devices 753, to cover the other pads 704 and 724 without interfering therewith during current or future transfer steps. Typically, the length of the void areas is the full length of the donor substrate 751. For pad clusters 740 of three pads 704, 714, and 724, the donor substrate 751 for the middle pads 714 may include arrays of micro devices 753 laterally separated by twice the pitch of the pads, and vertically separated by the pitch of the pads. The donor substrate 751 may be comprised of columns and rows of micro devices 753 and 755, and include void areas defined by a number of missing columns or rows equal to the number of pads, e.g. 704 and 724, adjacent to the receiver pad, e.g. 714, on each side thereof. The number of columns in each array is dependent upon the spacing between the pads 704 and 724 in adjacent pixels 730. For example, the donor substrate 751 for the receiver pad 714, which includes one adjacent pad 704 to the left, and one pad 724 to the right, may include a void area with one missing column of micro devices on each side, if the pitch of the micro devices 753 and 755 is the same as the pads 714 and 724. Alternatively, if the pitches are different, then the void area may be at least the distance from the pad, e.g. pad 714, mounted to the far edge of the farthest pad, e.g. pad 704 or 724.

Figure 8:
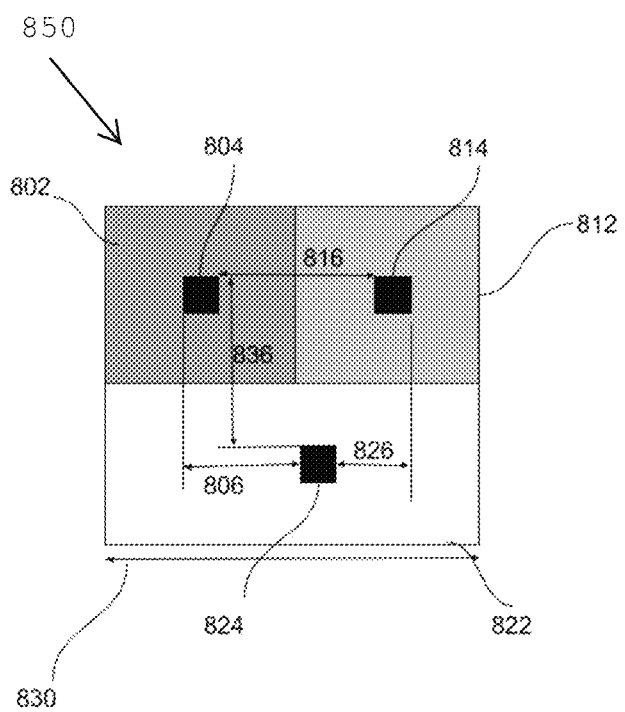
FIG. 8 illustrates an example of a receiver substrate with pads in the pixel arranged in two directions.

FIG. 8 illustrates another pixel orientation embodiment 850, in which the sub-pixels 802, 812 and 822 are distributed in two dimensions, e.g. horizontally and vertically. The pads 804, 814 and 824 are shown in each corresponding sub-pixel 802, 812 and 822 area. A horizontal distance 806 is between the pads 804 and 824, a horizontal distance 816 is between pads 804 and 814, a horizontal distance 826 is between pads 824 and 814, and a vertical distance 836 is between pad 824 and pads 804 and 814. The distances 806, 816, 826, and 836 are used to define the interfering and non-interfering areas. The sub-pixels 802, 812 and 822 may be aligned in vertical and horizontal orientations (or diagonally). For example, pads 814 and 824 may be aligned vertically and so horizontal distance 826 may be zero.

Figure 9A:
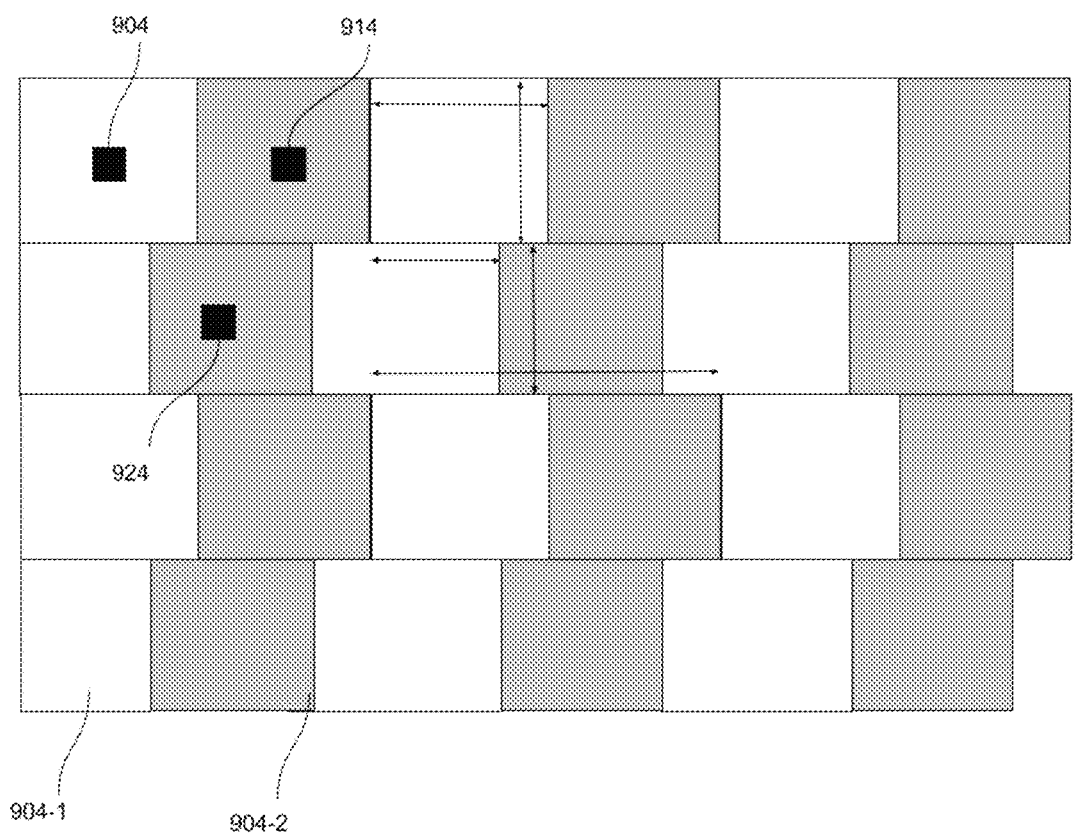
FIG. 9A illustrates an embodiment of a donor substrate with a non-interfering area associated with the one of the pads in the pixel.
Figure 9B:
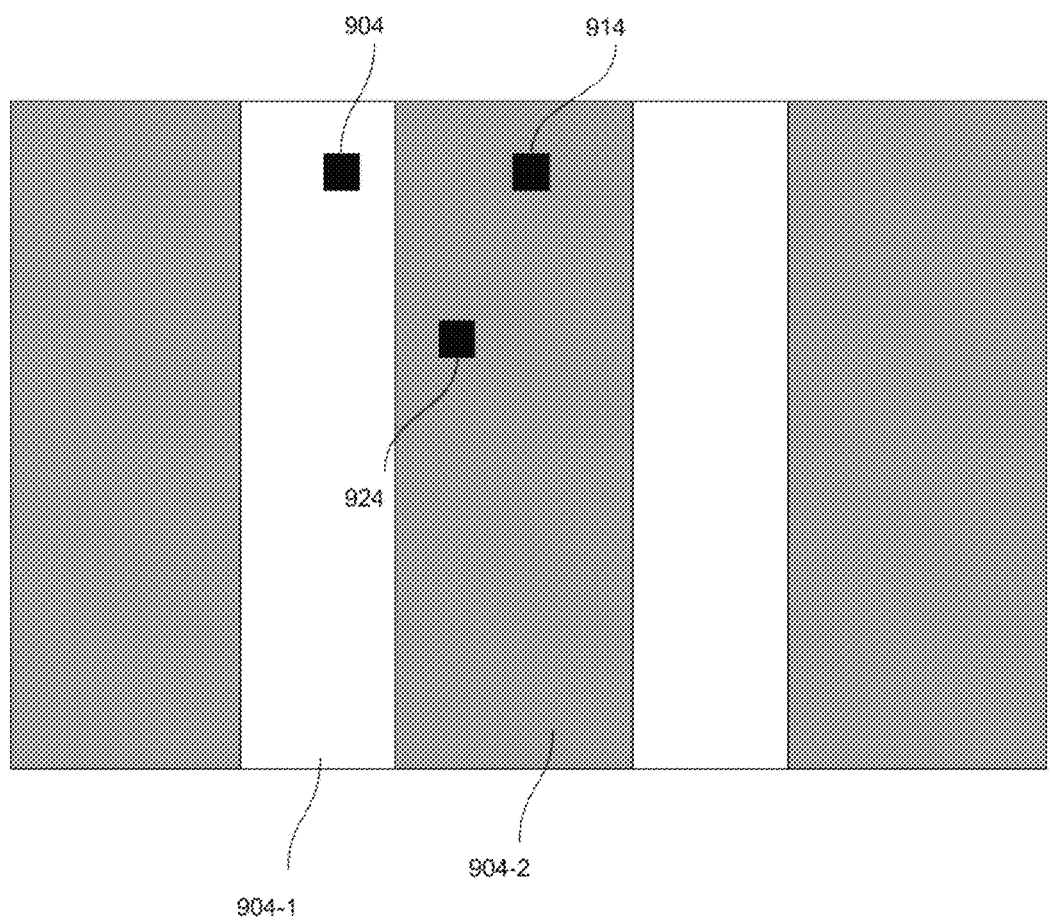
FIG. 9B illustrates another embodiment of a donor substrate with a non-interfering area associated with the one of the pads in the pixel.
Figure 9C:
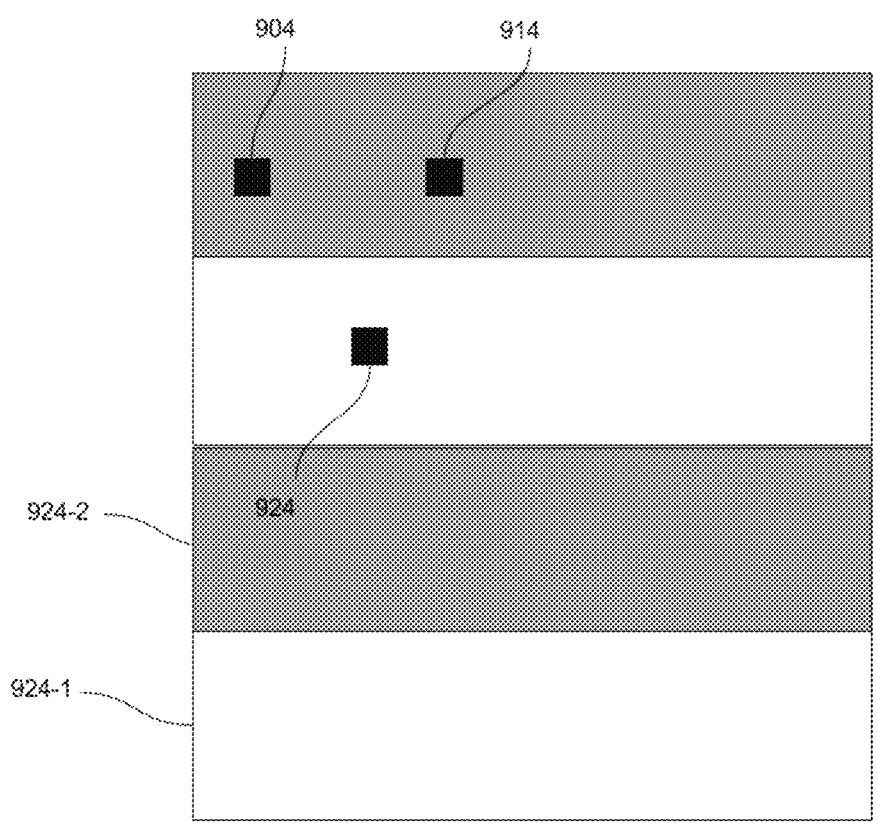
FIG. 9C illustrates another embodiment of a donor substrate with a non-interfering area associated with the one of the pads in the pixel.
Figure 9D:
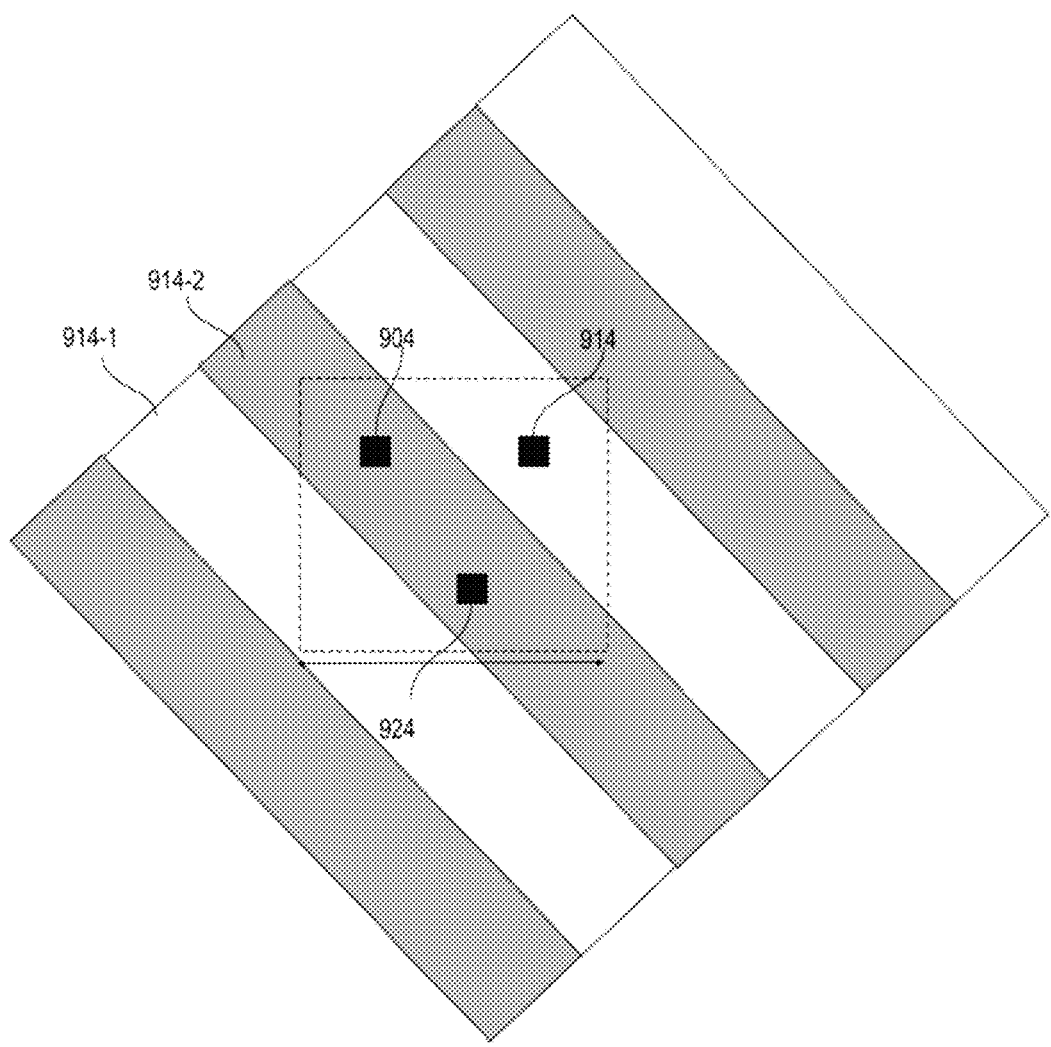
FIG. 9D illustrates another embodiment of a donor substrate with a non-interfering area associated with the one of the pads in the pixel.

FIGS. 9A-9D illustrate some examples for the interfering areas and the non-interfering areas for different pads 904, 914 and 924. FIG. 9A is for pad 904 based on horizontal and vertical offsetting of micro devices. In this case, the non-interfering areas 904-1 and interfering area 904-2 may be a combination of boxes around or offset from the pads 904, 914, 924. FIG. 9B shows another example of the non-interfering area 904-1 and the interfering area 904-2 for pad 904. Here, the denominator of the two non-interfering areas between pad 904 and 914 and pads 904 and 924 is used as the non-interfering area for pad 904. FIG. 9C shows horizontal non-interfering area 924-1 and interfering area 924-2. For pad 914, the most optimized case is based on diagonal offsetting. FIG. 9D shows the diagonal strips for the non-interfering area 914-1 and the interfering area 914-2. Other patterns also may be used with different offsetting direction. In this embodiment different pad heights, as described in FIG. 4, may be used to improve the device utilization for some of the pads.

Figure 10:
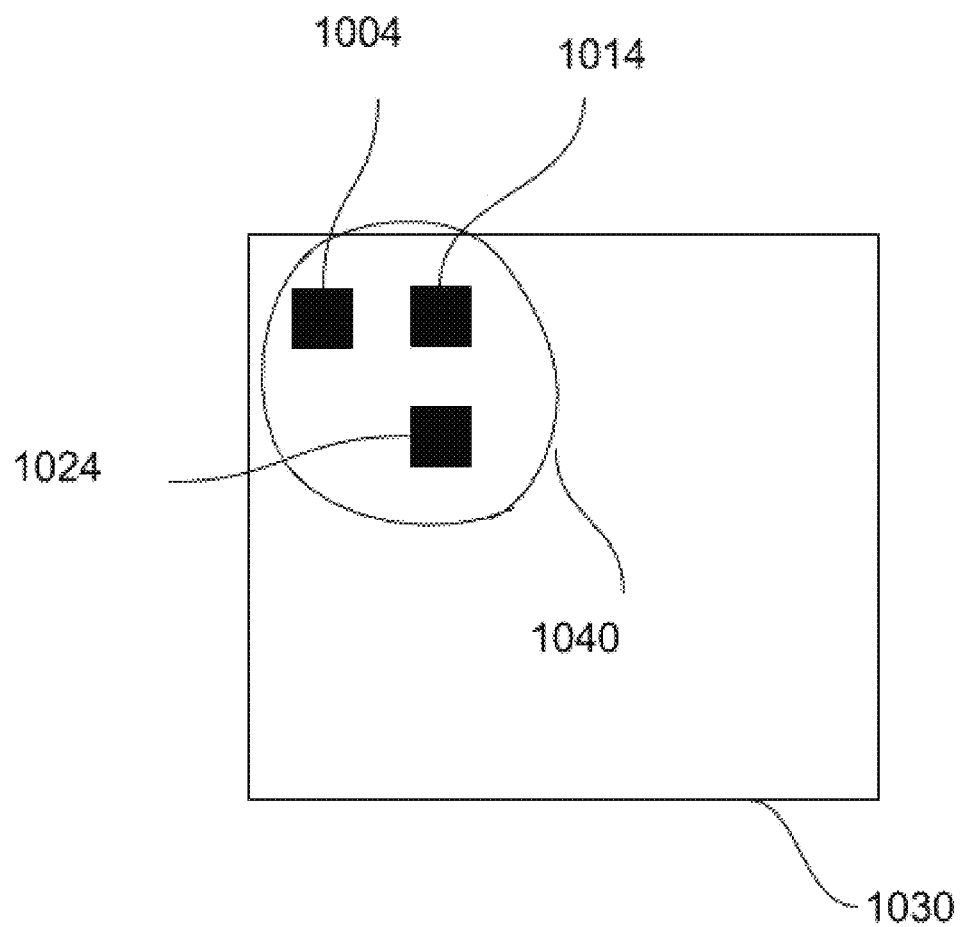
FIG. 10 illustrates an embodiment with cluster pads to improve the non-interfering area for the pixel pads arranged in two directions.

FIG. 10 illustrates another embodiment of a cluster pad 1040, in which the pads 1004, 1014 and 1024 are in two dimensions. Similar to FIG. 5, the pads 1004, 1014 and 1024 may have a different pitch depending on the different pitches of the micro devices on the donor substrate.

Figure 11A:
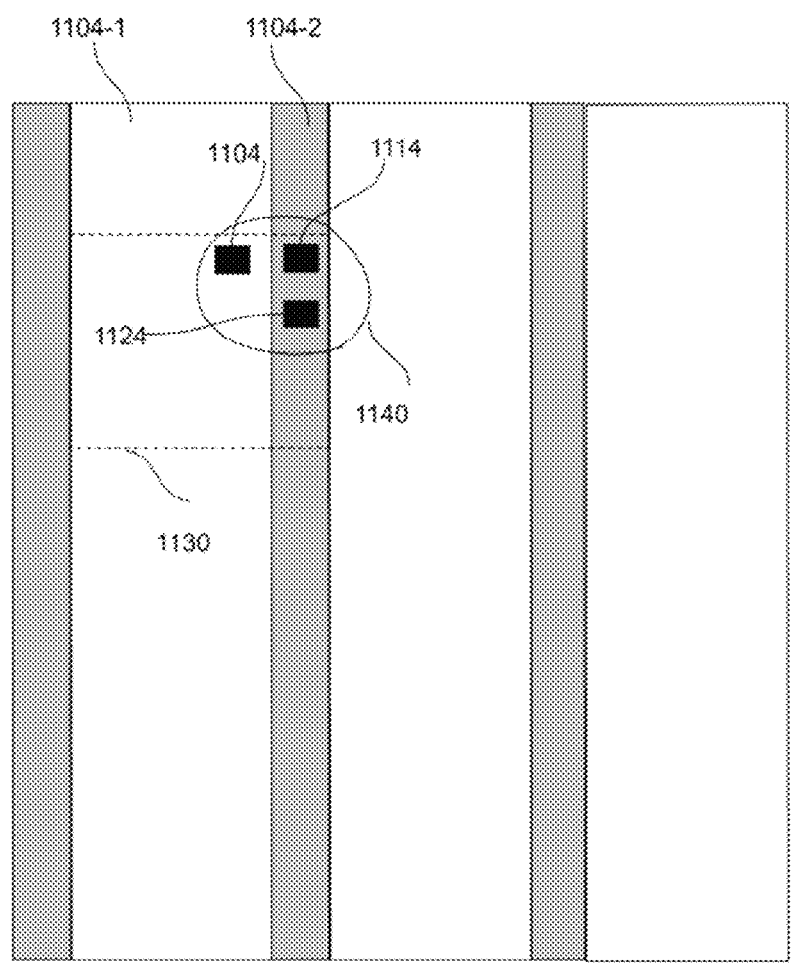
FIG. 11A illustrates an embodiment of a donor substrate with a non-interfering area associated with the one of the pads in the cluster.
Figure 11B:
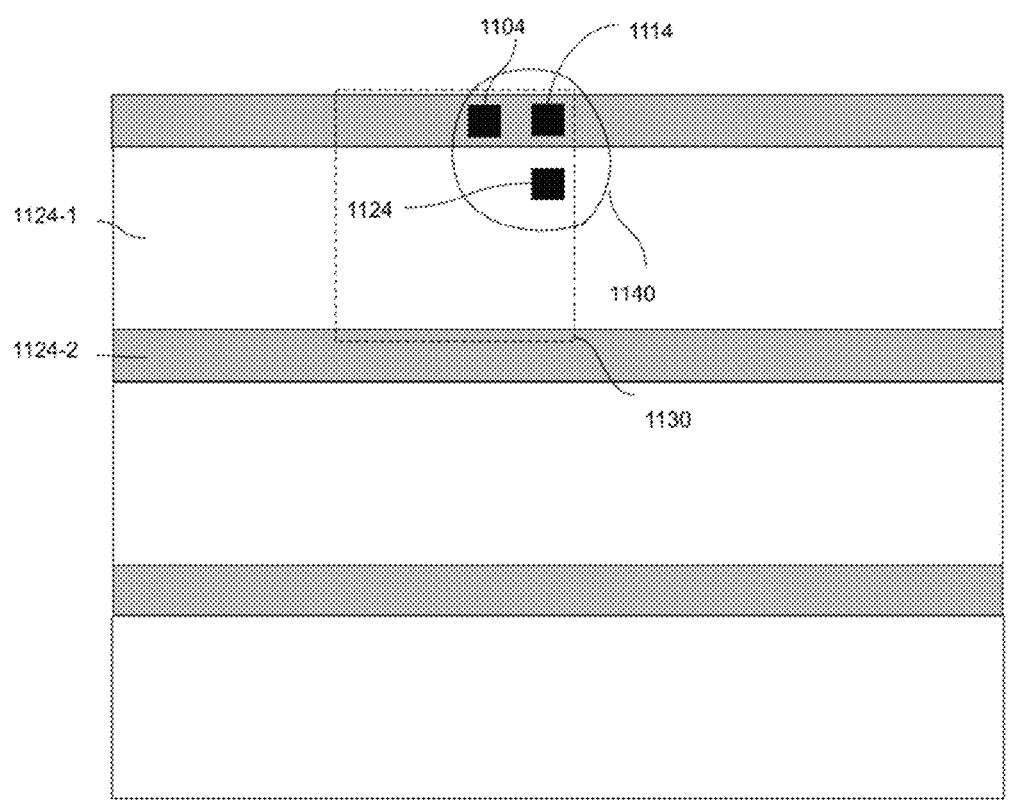
FIG. 11B illustrates another embodiment of a donor substrate with a non-interfering area associated with the one of the pads in the cluster.
Figure 11C:
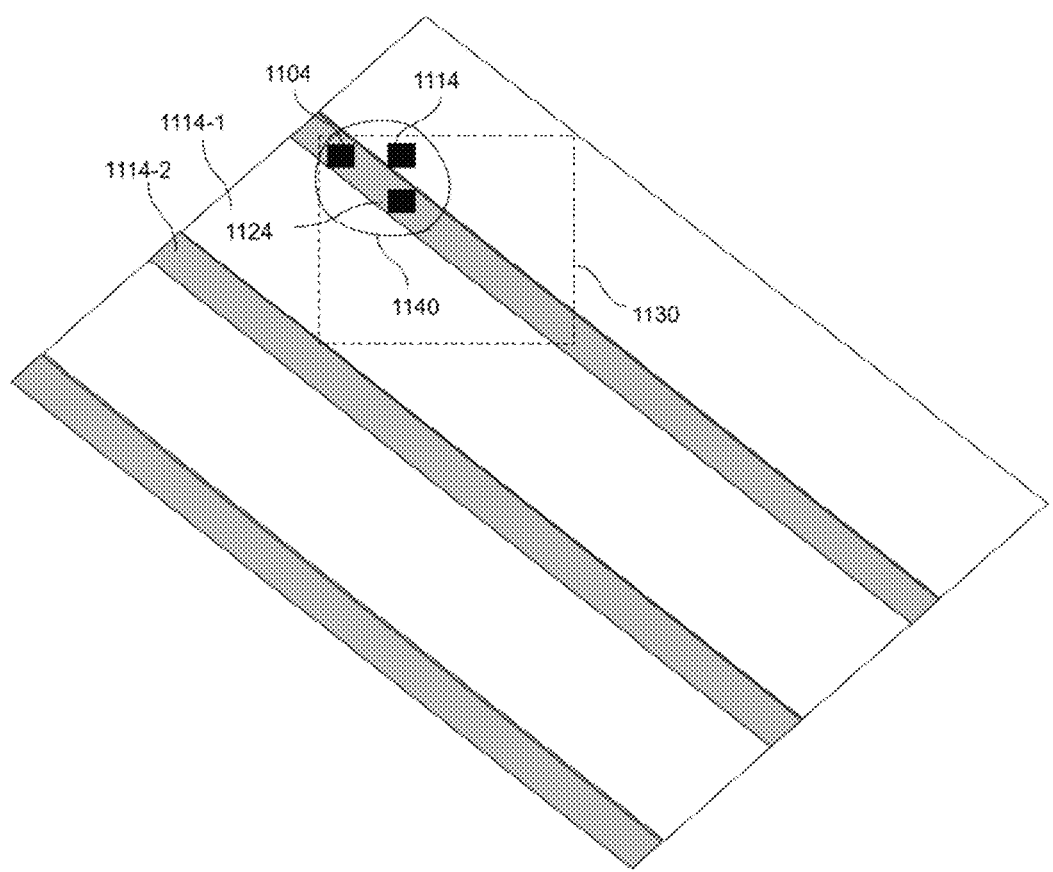
FIG. 11C illustrates another embodiment of a donor substrate with a non-interfering area associated with the one of the pads in the cluster.

FIG. 11 illustrates a non-interfering area 1104-1, and an interfering area 1104-2 for a pad 1104 at the edge of a cluster 1140. The non-interfering areas for the pads at the edge are larger than previous cases. FIG. 11B shows a non-interfering area 1124-1 and an interfering area 1124-2 for a pad 1124. For the pad 1114 in the middle, a non-interfering area 1114-1 and an interfering area 1114-2 may be a diagonally striped pattern, as demonstrated in FIG. 11C. Here, the width of the stripe is the same as the distance, e.g. center to center or the diagonal pitch, between the middle pad 1114 and the other pads 1104 and 1124. If the distance between the middle pad 1114 and the other pads 1104 and 1124 is the same, the ratio of the interfering area 1114-2 to the non-interfering area 1114-1 may be the same. Similar to FIG. 3B, the two areas can have different shapes depending on the offsetting direction. Also, similar to FIG. 4, the middle pad 1114 can be taller and so in this case the non-interfering area 1114-1 for the middle micro device 1114 may be the entire donor substrate.

FIGS. 12A to 12D illustrates an embodiment in which the pads 1204, 1214 and 1224 in a receiver substrate 1200 have the same pitch as micro devices 1252 and 1254 in a donor substrate 1250. The position of a pad cluster 1240 on the receiver substrate 1200 may be different in reference to the pixels 1230 on the donor substrate 1250. The size of the pads 1204, 1214 and 1224 may be smaller or similar or larger than the micro devices 1252 and 1254. The shape of the micro devices 1252 and 1254, and the pads 1204, 1214 and 1224 may be any suitable shape and size. In this embodiment, the micro devices 1252 and 1254 are removed (or nonpopulated) from the interfering area on the donor substrate 1250.

Figure 12A:
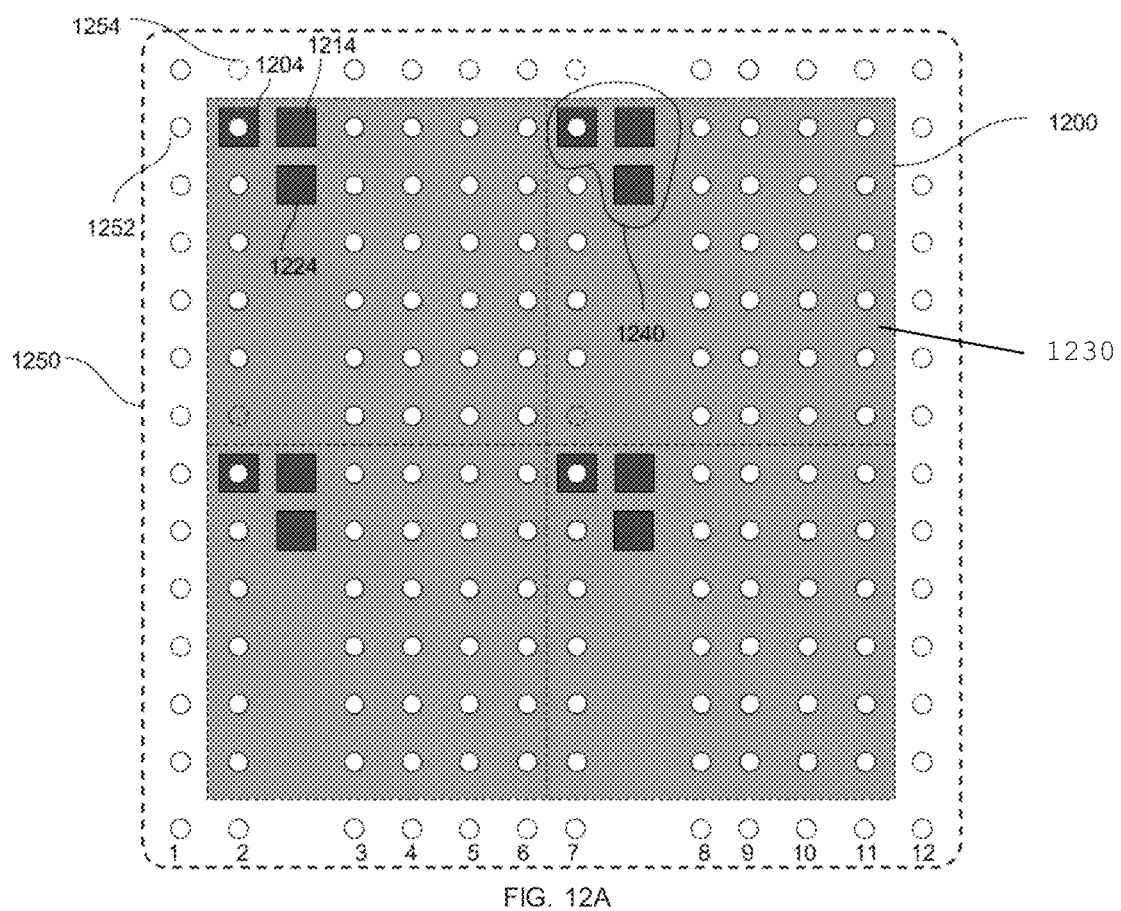
FIG. 12A illustrates an example of a donor substrate and a receiver substrate with cluster pads arranged in two directions.

FIG. 12A illustrates an embodiment of a donor substrate 1250 for the edge pad 1204. Some of the micro devices 1254 may have already been transferred to the receiver substrate 1200, and the donor substrate 1250 (or receiver substrate 1200) is offset vertically and/or horizontally with reference to the next receiver substrate 1200 (or the donor substrate 1250) so that another micro device 1254 is aligned with the bare pads 1204 on a subsequent receiver substrate 1200 (pads to which no micro device has yet been transferred). In the illustrated embodiment, a plurality of arrays or blocks of micro devices 1252 and 1254 are provided on the donor substrate 1250. Within each array of micro devices the spacing or pitch of the micro devices may be consistent, e.g. a first predetermined pitch, and is ideally the same pitch or spacing as the pads 1204 and 1214. Each array of micro devices is separated by a void, i.e. an interfering area defined by a distance across of at least N times the pitch or spacing between the pads, or from one side of the closest pad to the far side of the farthest pad, e.g. 1204 or 1214, where N is the number of adjacent pads, e.g. 1204 or 1214. Typically, the length of the void areas is the full length of the donor substrate 1250. In this case, the empty spaces on the donor substrate 1250 created by transferring the micro device 1254 may be a new empty area, which could be on top of other pads 1214, 1224 in subsequent receiver substrates 1200. As such, there will be no interference caused by the micro devices for the unwanted pads 1214, 1224. One can finish all the micro devices 1254 in one column by offsetting vertically first and then moving to the next column (for example, after finishing column 2, moving to column 1). However, other combinations of vertical and horizontal offsetting can be used. The pixels 1230 or the pad clusters 1240 can be at an angle either vertically or horizontally. In this case, the rows or columns of the micro devices will be tilted as well. In addition, the micro devices 1252 and 1254 may be at an angle without the pads or pixels being at angles. In this case, the offsetting direction will be toward the angle of the column or the row.

The donor substrate 1250 may be comprised of columns and rows of micro devices 1252 and 1254, and includes void areas defined by a number of missing columns or rows equal to the number of pads, e.g. 1214, adjacent to the receiver pad, e.g. 1204, on each side thereof. The number of columns in each array is dependent upon the spacing between the pads 1204 and 1214 in adjacent pixels 1230. For example, the donor substrate 1250 for the pad 1204, which includes one adjacent pad 1214 (pad 1224 is the same lateral distance) to the right and none to the left, may include a void area with one missing column of micro devices, if the pitch of the micro devices 1252 and 1254 is the same as the pads 1204 and 1214. Alternatively, if the pitches are different, then the void area may be at least the distance from the pad, e.g. pad 1204, being mounted to the far edge of the farthest pad, e.g. pad 1214.

Figure 12B:
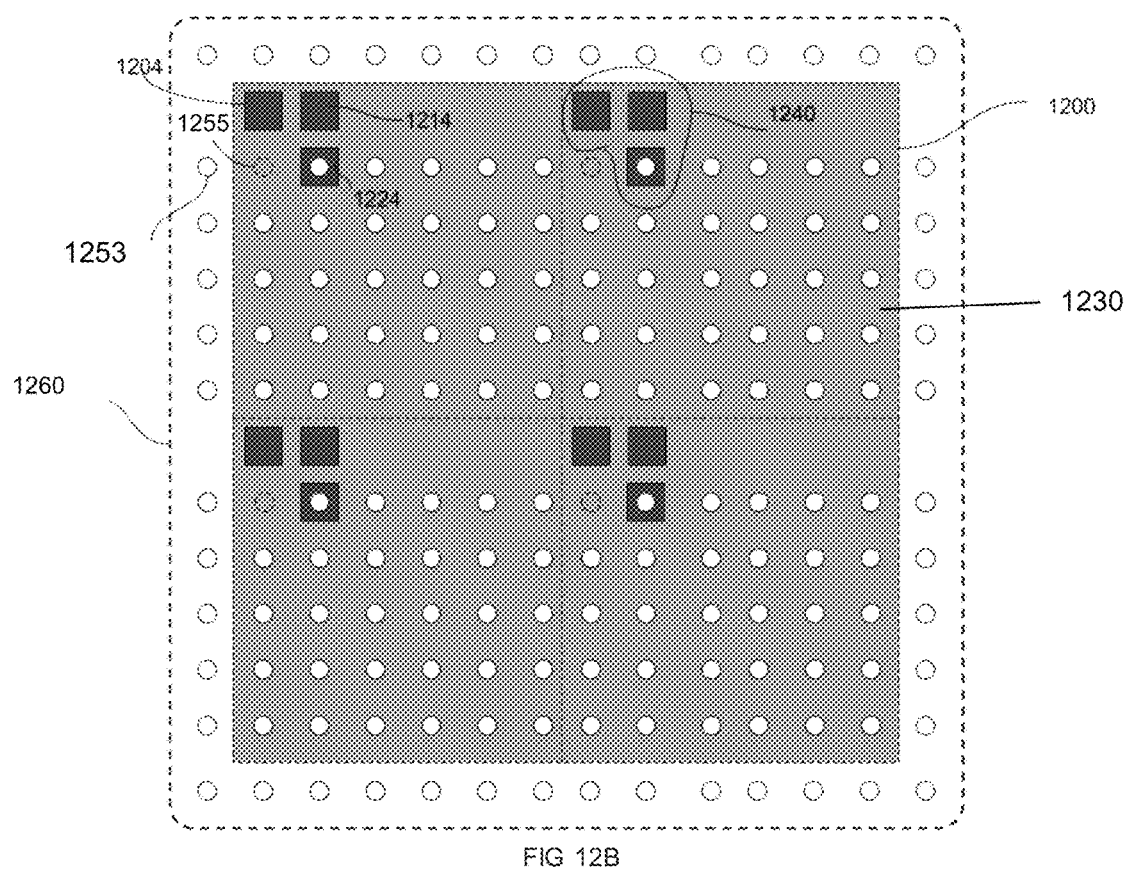
FIG. 12B illustrates an example of a donor substrate and a receiver substrate with cluster pads arranged in two directions.

FIG. 12B shows a similar structure for the donor substrate 1260, as in FIG. 12A, for the middle pad 1224 on the receive substrate 1200. However, the interfering area with no micro device extends horizontally across the donor substrate 1260 to avoid interfering with pads 1204 and 1214. As above, each donor substrate 1260 includes a plurality of arrays or blocks of micro devices 1253 and 1255. Within each array of micro devices, the spacing or pitch of the micro devices may be the same, e.g. a first predetermined pitch, ideally the same pitch or spacing as the pads 1204 and 1214, but may have a larger or smaller pitch. Each array of micro devices 1253 is separated by a void, i.e. an interfering area, of N times the pitch or spacing between the pads from one side of the closest pad to the far side of the farthest pad, e.g. 1204 or 1214, where N is the number of adjacent pads, e.g. 1204 and 1214. Typically, the length of the void areas is the full length or width of the donor substrate 1260. The donor substrate 1260 for the middle pad 1224 is moved laterally, i.e. perpendicular to the donor substrate 1250 for the pad 1204, for subsequent receiver substrates 1200.

Figure 12C:
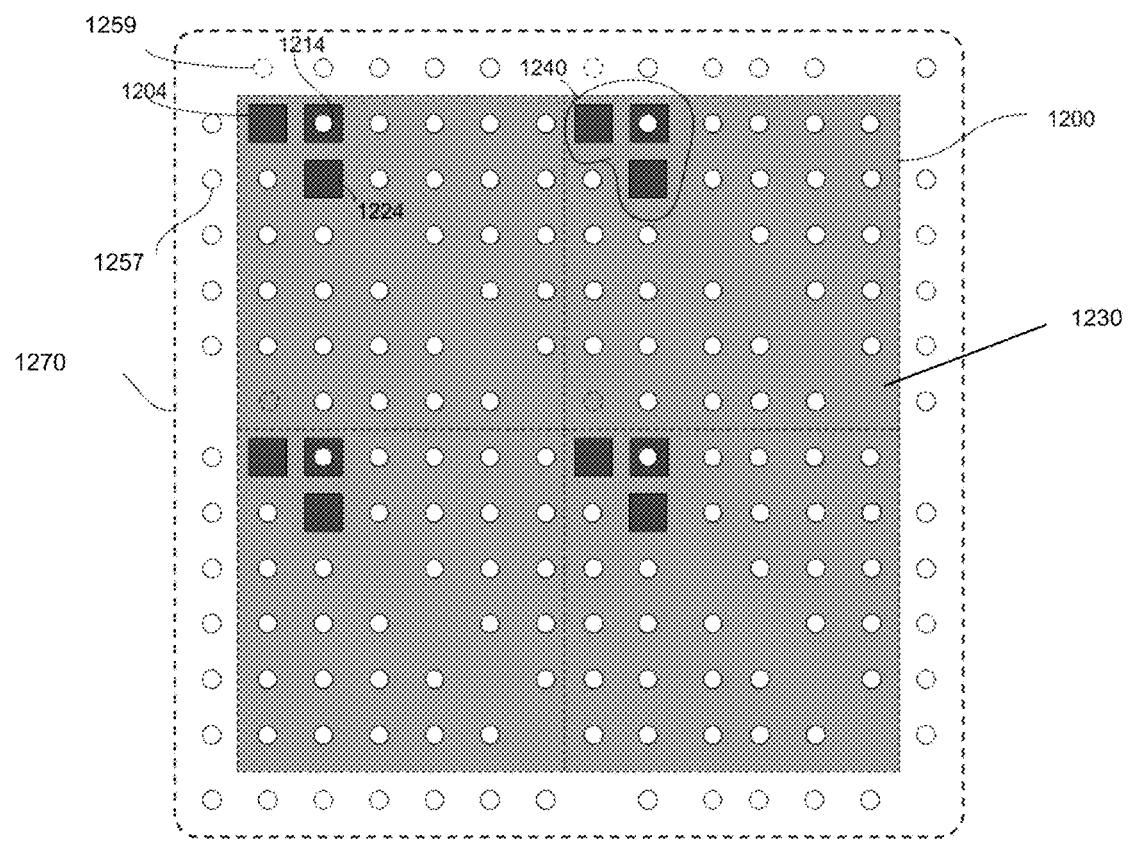
FIG. 12C illustrates an example of a donor substrate and a receiver substrate with cluster pads arranged in two directions.

FIG. 12C shows the donor substrate 1270 for the middle pad 1214. Here, the interfering area is diagonal, e.g. at an acute angle, relative to the sides of the donor substrate 1270, and offsetting of the donor substrate 1270 (or receiver substrate 1200) for subsequent receiver substrates 1200 (or donor substrates 1270) is done diagonally, or vertically and horizontally. The donor substrate 1270 may be comprised of columns and rows of micro devices 1257 and 1259, and include void areas defined by a number of missing columns or rows equal to the number of pads, e.g. 1204 and 1224, adjacent to the receiver pad, e.g. 1214, on each side thereof. The number of columns in each array is dependent upon the spacing between the pads 1214 and 1204 in adjacent pixels 1230. For example, the donor substrate 1270 for the pad 1214, which includes one adjacent pad 1204 to the left, and one pad 1224 below (both are the same lateral distance diagonally) and none to the right, may include a void area with one missing diagonal column of micro devices, if the pitch of the micro devices 1257 and 1259 is the same as the pads 1214 and 1224. Alternatively, if the pitches are different, then the void area may be at least the distance from the pad, e.g. pad 1214, mounted to the far edge of the farthest pad, e.g. pad 1224.

Figure 12D:
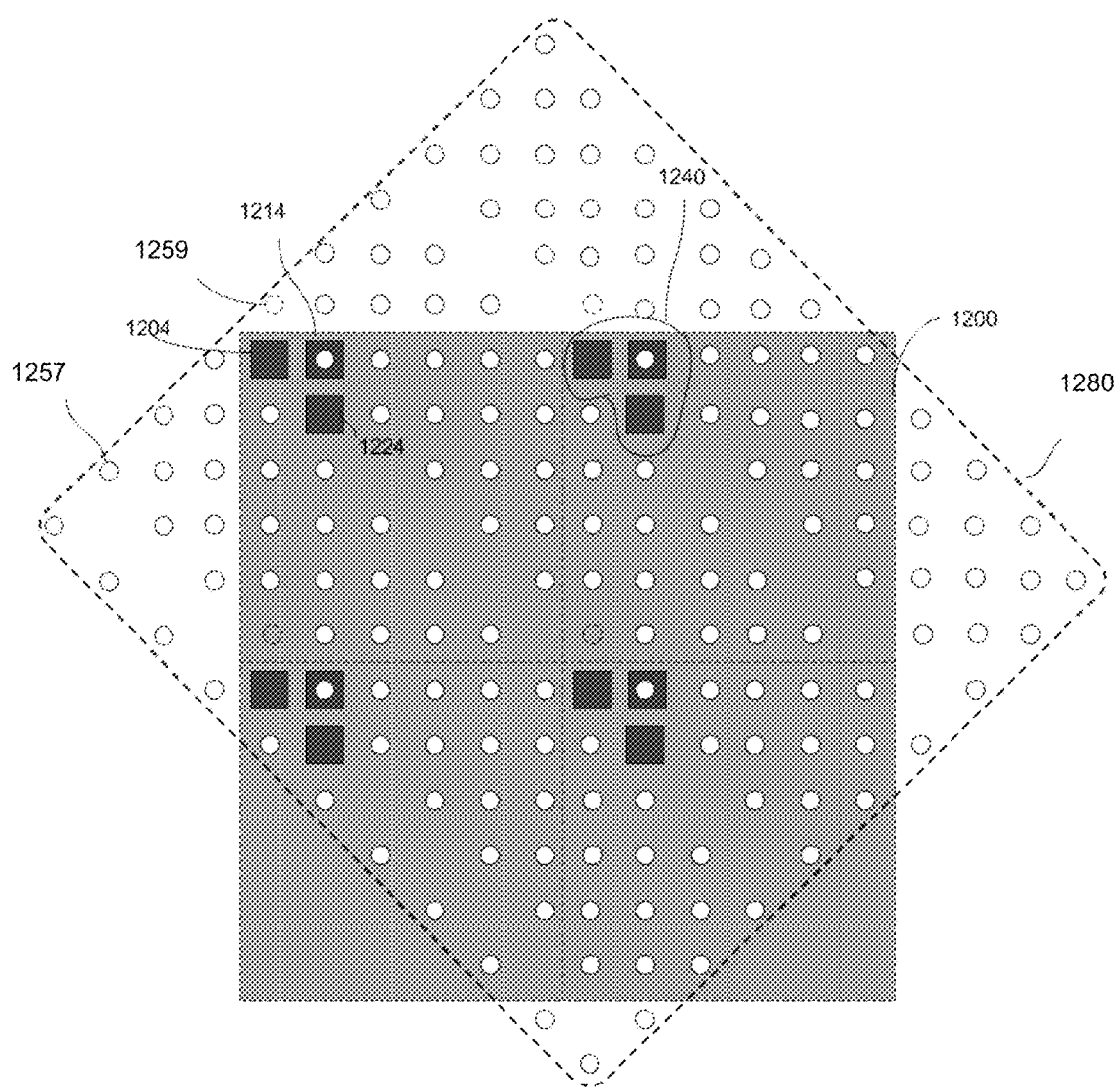
FIG. 12D illustrates an example of a donor substrate and a receiver substrate with cluster pads arranged in two directions.

FIG. 12D illustrates a donor substrate 1280, which has a similar structure to the donor substrate 1260 for transferring to the pad 1214, but with a slightly different arrangement for the micro devices 1257 and 1259 to maximize the transfer. The voids in the donor substrate 1270 are parallel (or perpendicular) to the sides of the donor substrate 1270, but the donor substrate 1270 is rotated, e.g. 45°, relative to the receiver substrate 1200.

Figure 13A:
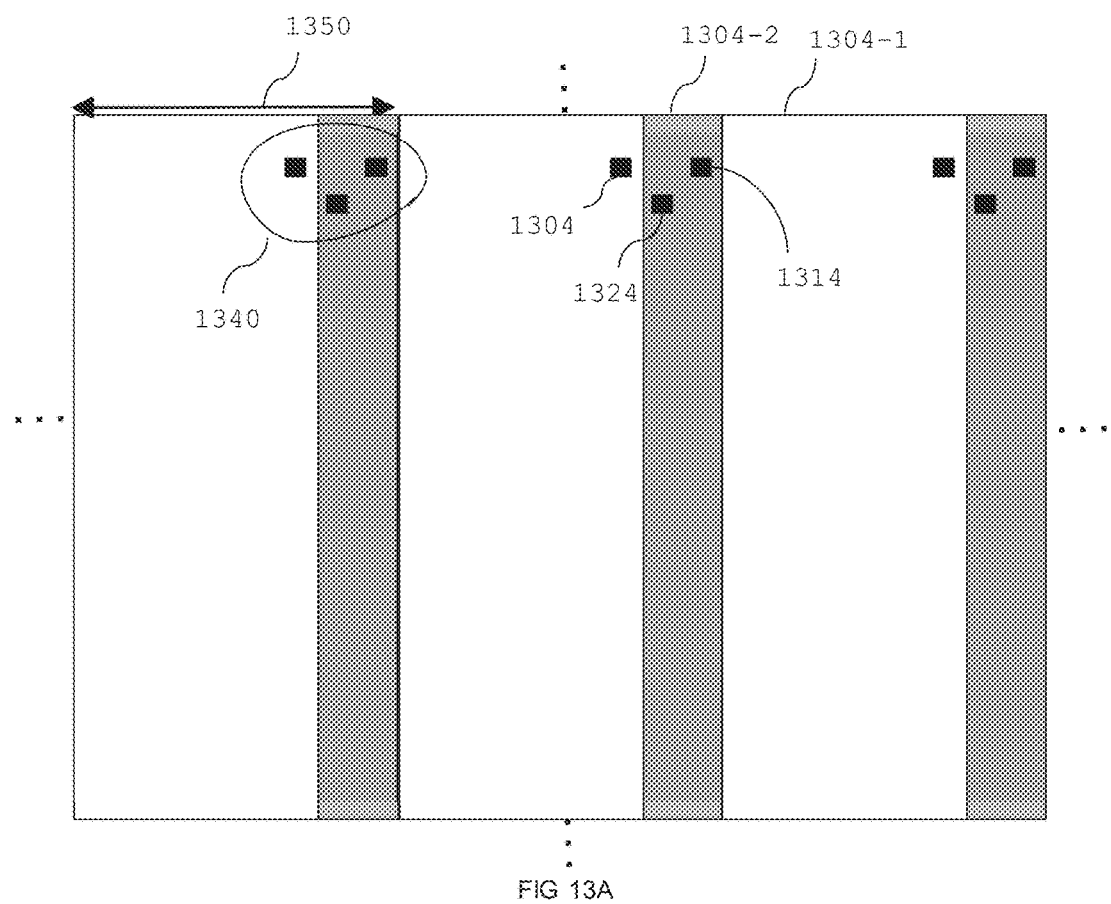
FIG. 13A illustrates an embodiment of a pad cluster in a receiver substrate and a donor substrate with a non-interfering area associated with reference to the one of the pads in the cluster.
Figure 13B:
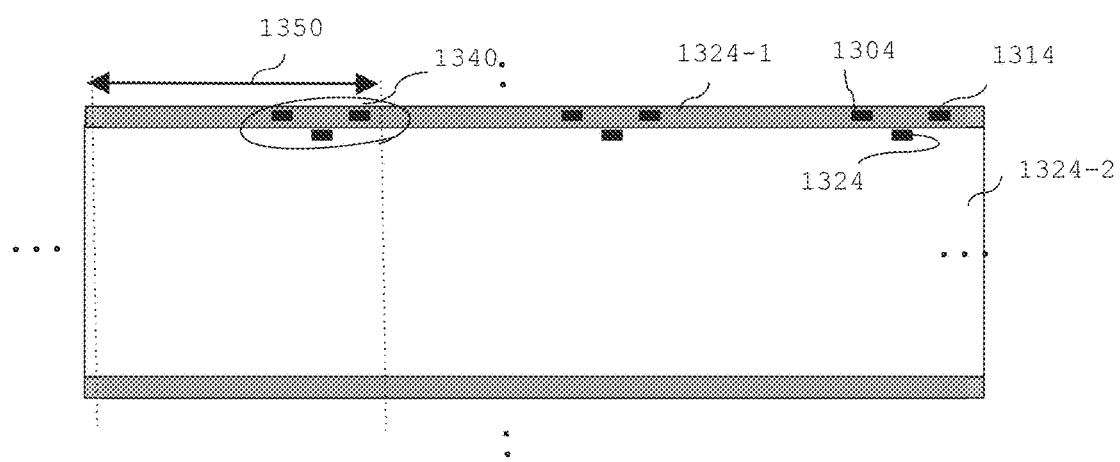
FIG. 13B illustrates another embodiment of a donor substrate with a non-interfering area associated with the one of the pads in the cluster.

FIG. 13A shows a non-interfering area 1304-1, and an interfering area 1304-2 for the pad 1304 at the edge of the cluster 1340 for a pixel width 1350 corresponding to a void area on a donor substrate. As seen, the non-interfering areas 1304-1 for the pads at the edge are larger than previous cases. The same pattern may be used for the pad 1314. For the pad 1324 in the middle, the non-interfering area 1324-2 and interfering area 1324-1 can be a vertical stripe pattern as demonstrated in FIG. 13B. Here, the width of the non-interfering area 1324-2 is the same as the distance between the middle pad 1314 and the other pads 1304, 1324 in the other pixel. If the distance between the middle pad and the other pads is the same, the ratio of interfering area 1324-1 to non-interfering area 1324-2 may be the same. Similar to FIG. 3B, here the interfering and non-interfering areas 1324-1 and 1324-2 may have different shapes depending on the offsetting direction. Also, similar to FIG. 4, one of the pads may be taller and so in this case the non-interfering area for the middle micro device may be the entire donor substrate.

Figure 14A:
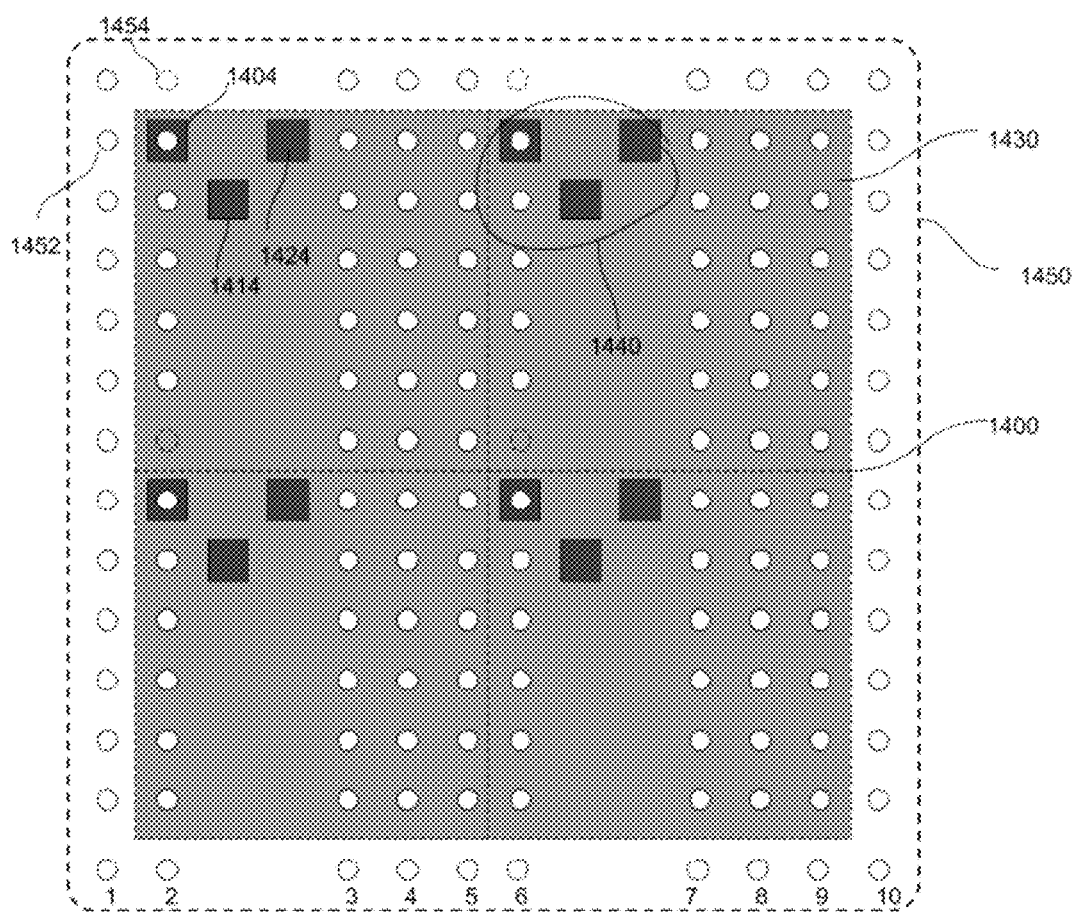
FIG. 14A illustrates an example of a donor substrate and a receiver substrate with cluster pads arranged in two directions.
Figure 14B:
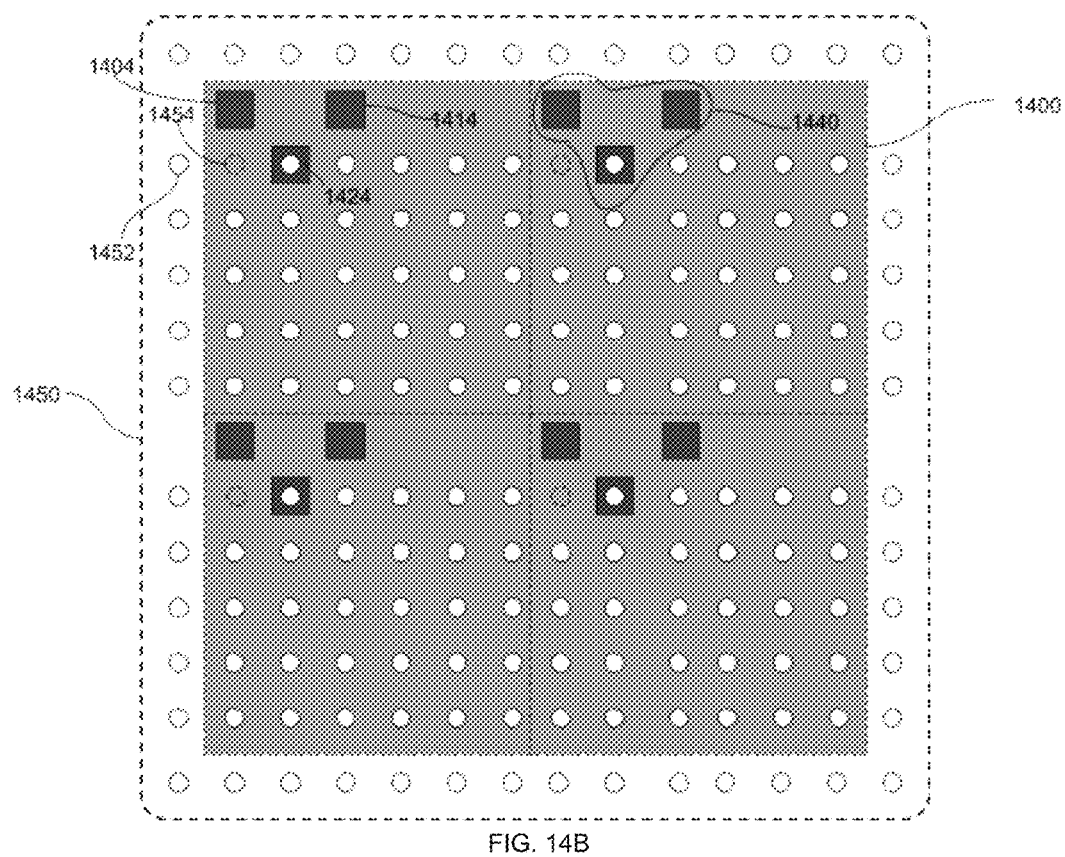
FIG. 14B illustrates an example of a donor substrate and a receiver substrate with cluster pads arranged in two directions.

FIGS. 14A and 14B illustrate an embodiment in which pads 1404, 1414 and 1424 in a receiver substrate 1400 have the same pitch as micro devices in donor substrates 1450 and 1460. The position of a pad cluster 1440 may be different with reference to the pixels 1430. The size of pads 1404, 1414 and 1424 may be smaller or similar or larger than the micro devices 1452, 1454, 1455 and 1457. The shape of the micro devices 1452, 1454, 1455 ad 1457 and the pads 1404, 1414 and 1424 may be any suitable size or shape. In this case, the micro devices 1452, 1454, 1455 and 1457 may be removed (or nonpopulated) from the interfering area on the donor substrates 1450 and 1460.

FIG. 14A illustrates an embodiment of a donor substrate 1450 for the edge pad 1404. Some of the micro devices 1454 may already have been transferred to the receiver substrate 1400, and the donor substrate 1450 (or receiver substrate 1400) is offset vertically and/or horizontally with reference to the next receiver substrate 1400 (or the donor substrate 1450) so that another micro device 1452 is aligned with one of the bare pads 1404 (pads to which no micro device has been yet transferred). In the illustrated embodiment, a plurality of arrays of micro devices 1452 and 1454 are provided on the donor substrate 1450. Within each array of micro devices the spacing or pitch of the micro devices laterally and vertically may be the same, e.g. a first predetermined pitch, ideally the same pitch or spacing as the pads 1404 and 1414. Each array of micro devices is separated by a void, i.e. an interfering area, of N times the pitch of the pads or a spacing between the pads or the lateral or vertical distance from one side of the closest pad to the far side of the farthest pad, e.g. 1414 and 1424, where N is the number of laterally or vertically adjacent pads, e.g. two in this case 1414 and 1424. Typically, the length of the void areas is the full length of the donor substrate 1450.

In this case, the empty spaces created by transferring the micro device 1454 will be a new empty area which will be on top of other pads 1414 and 1424. As such there will be no interference caused by the micro devices for the unwanted pads 1414 and 1424. One can finish all the micro devices in one column by offsetting vertically first and then moving to the next column (for example, after finishing column 2, moving to column 1). However, other combinations of vertical and horizontal offsetting may be used. The pixels 1430 or the pad clusters 1440 may be at an angle to each other, either vertically or horizontally. In this case, the rows or columns of the micro device may be tilted as well. In addition, the micro devices may be at an angle without the pads or pixels being at angles. In this case, the offsetting direction will be toward the angle of the column or the row.

The donor substrate 1450 may be comprised of columns and rows of micro devices 1452 and 1454, and includes void areas defined by a number of missing columns or rows equal to the number of pads, e.g. 1414 and 1424, adjacent to the receiver pad, e.g. 1404, on each side thereof. The number of columns in each array is dependent upon the spacing between the pads 1424 and 1404 in adjacent pixels 1430. For example, the donor substrate 1450 for the receiver pad 1404, which includes two laterally spaced adjacent pads 1414 and 1424 to the right (pad 1414 is equally spaced from pads 1404 and 1424), and none to the left, may include a void area with two missing columns of micro devices, if the pitch of the micro devices 1452 and 1454 is the same as the pads 1414 and 1424. Alternatively, if the pitches are different, then the void area may be at least the distance from the pad, e.g. pad 1404, being mounted to the far edge of the farthest pad, e.g. pad 1424.

FIG. 14B illustrates a donor substrate 1460, similar to the structure in FIG. 14A, but for the middle pad 1414. However, the interfering area with no micro devices 1455 and 1457 is a horizontal void, e.g. row, with a single column of micro devices missing, e.g. pads 1404 and 1424 vertically spaced by one pitch distance from the receiver pad 1414.

Figure 15A:
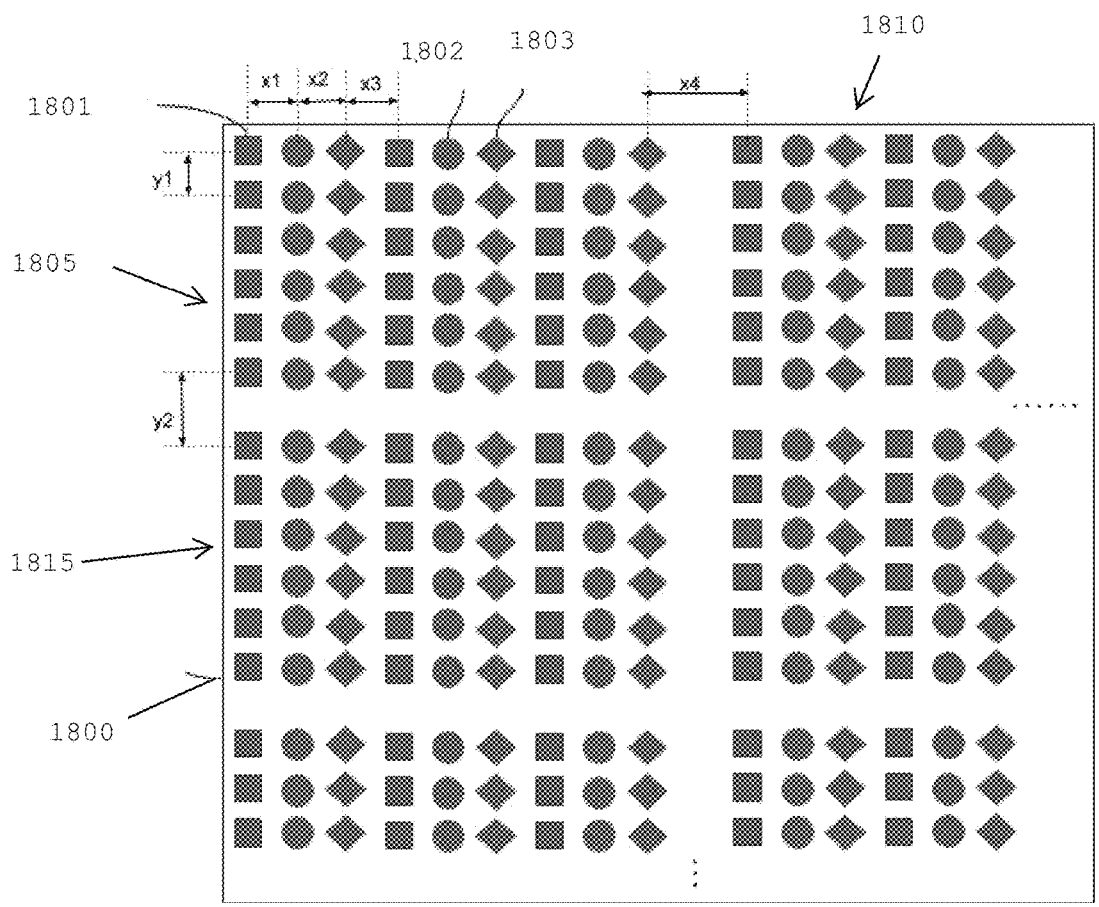
FIG. 15A illustrates an example of a donor (cartridge) substrate with different types of micro devices.

FIG. 15A illustrates one example of a multi-type microdevice cartridge 1800. The cartridge 1800 includes three different types, e.g. colors, of micro devices 1801, 1802, 1803, e.g. blue, green and red. However, any number and variety of different types of devices may be possible. The distances between the micro devices 1801, 1802 and 1803, i.e. x1, x2, x3, respectively, are related to the pitch of the landing areas in the receiver substrate, e.g. receiver substrate 700 from FIGS. 7A and 7B. After an array or first set of micro devices 1805, which may be related to the pixel pitch in the receiver substrate, there may be a different pitch x4, y2, i.e. a void area or interfering area, between adjacent sets 1805 and 1815 of micro devices 1801, 1802 and 1803. The separation or pitch is to compensates for a mismatch between the pixel pitch and the micro device pitch (landing area pitch), and ensures that micro devices on the donor or cartridge substrate 1800 do not interfere with pads, e.g. the horizontally and vertically adjacent cluster 740, or existing micro devices on the receiver substrate, e.g. receiver substrate 700. For example, the void area may be an area defined by at least the distance from one side of an outer pad of the pixel to a far side of the outer pad at the opposite side of the pixel, or at least the distance of N times the pitch of the pads, where N is the number of adjacent pads in the pixel. The length may be the entire length of the cartridge 1800. In this case, if pick and place is used to develop the cartridge 1800, the force elements may be in the form of columns that correspond to the column of each micro device type or there can be a separate element for each micro device.

Figure 15B:
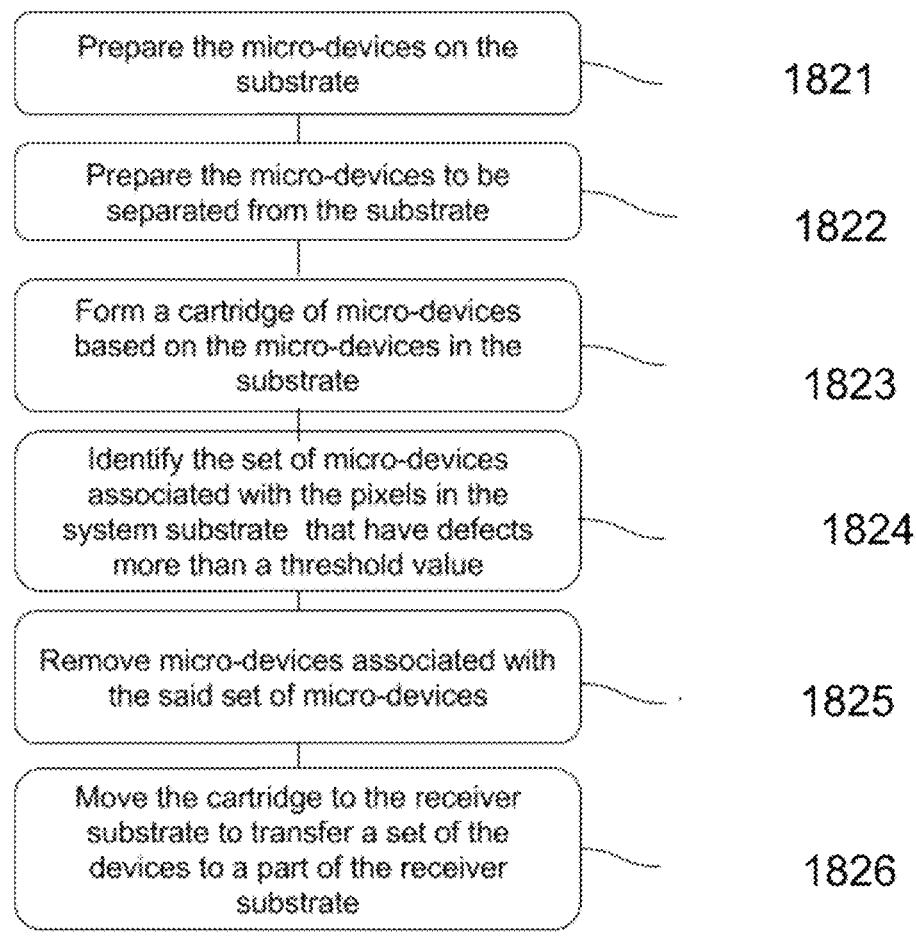
FIG. 15B is a flow chart of the process of the present invention.

With reference to FIG. 15B, during assembly, a first step 1821 includes preparing micro devices on the original donor substrates, e.g. donor substrates 750 or 1450. Then, in step 1822, the micro devices are prepared for separation from the donor substrates 750 or 1450. In step 1823, the micro devices from one or more donor substrates, e.g. 750 and 1450, are transferred onto the cartridge 1800, and arranged according to the pixel arrangement on the receiver substrate, e.g. 700 or 1400. The next step 1824, which is optional, involves identifying micro devices with defects, and either correcting them in place, or removing them and replacing them with an operating micro device in step 1825. The identification of defects may be conducted in the cartridge 1800 before transfer or on the receiver substrate 700 or 1400 after transfer, or both. Subsequently, or prior, to the identification and correction step 1824, a plurality of groups of micro devices 1801, 1802 and 1803, which may form a pixel, from each array or set of micro devices 1805, 1810 and 1815, may be mounted on the receiver substrate, e.g. receiver substrate 700, simultaneously from the cartridge 1800, in step 1826.

Figure 15C:
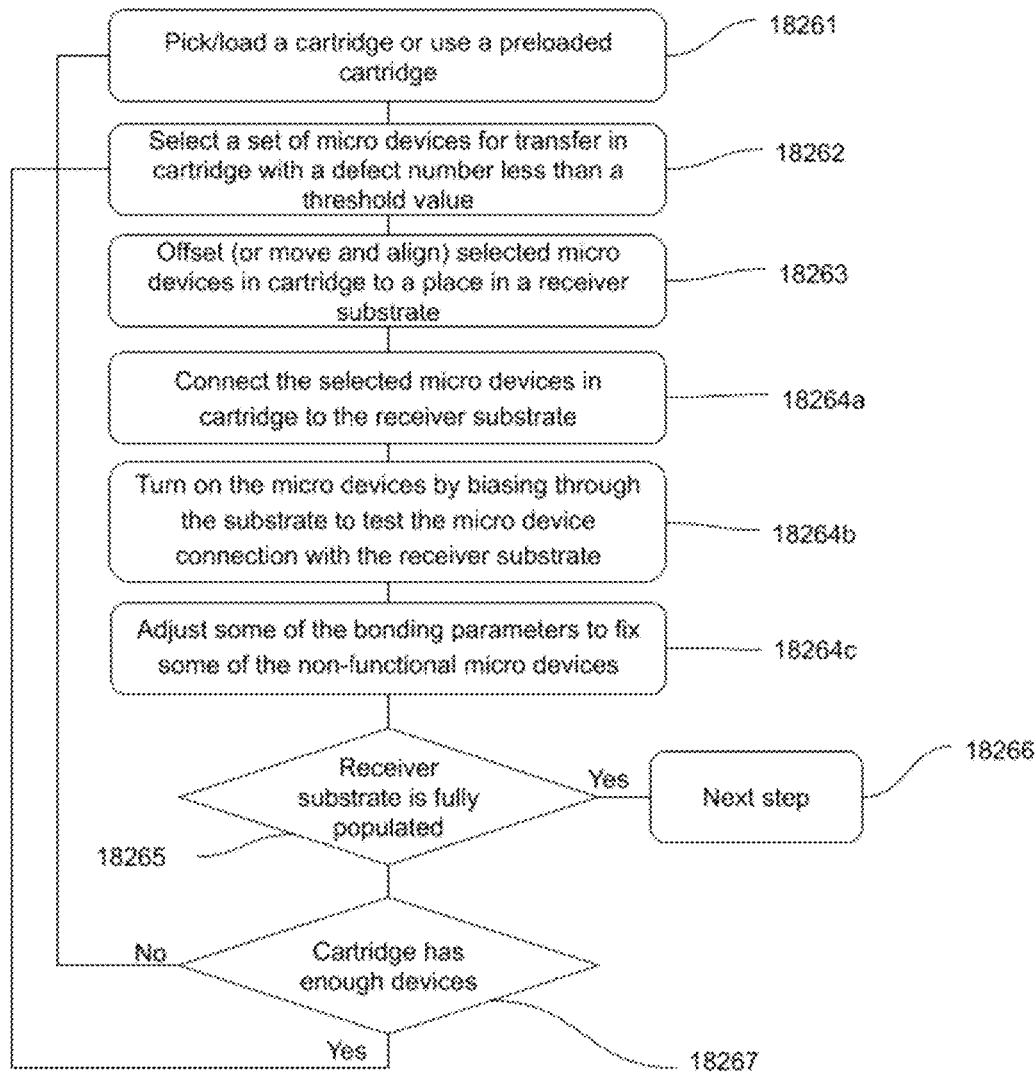
FIG. 15C is a flow chart of the micro device mounting process of the present invention.

With reference to FIG. 15C, the transfer step 1826 may be broken down into a logical loop, in which the first step 18261 comprises loading or selecting a first cartridge 1800. The next step 18262 comprises selecting a set of the micro devices on the cartridge 1800 for transfer, preferably ones already tested for defects, and that comprise a number of defects below a desired threshold value, e.g. less than 10%. Step 18263 comprises aligning the selected micro devices on the cartridge 1800, e.g. by moving or offsetting the cartridge 1800 or the receiver substrate, e.g. receiver substrate 700, or both, relative to the other, into alignment with a subsequent plurality of clusters of pads, e.g. cluster 740. The next step 18264 includes transferring the aligned micro devices on the cartridge 1800 to the pads on the receiver substrate, e.g. 700 or 1400. Step 18264 may be broken down into substeps including 18264a, in which the selected micro devices from the cartridge 1800 are connected to the receiver substrate, e.g. 700 or 1400. Substep 18264b comprises turning on the micro devices to test their connection to the receiver substrate, e.g. 700 or 1400. The test may be conducted by biasing the micro devices through the cartridge 1800 and/or the receiver substrate, e.g. 700 or 1400. If some of the micro devices are found to be defective, step 18264c includes adjusting one or more of the bonding parameters of the micro devices to correct the cause of the defect. Step 18265 determines whether the receiver substrate, e.g. 700 or 1400, is fully populated. If yes, in step 18266, the process proceeds to a new receiver substrate and the mounting process is repeated. If no, step 18267 determines if the cartridge 1800 includes enough micro devices to continue with further transfers. If yes, the process returns to step 18262 for the selection of the next set of micro devices to be transferred. If no, the process returns to step 18261 to select another cartridge 1800.

Figure 16:
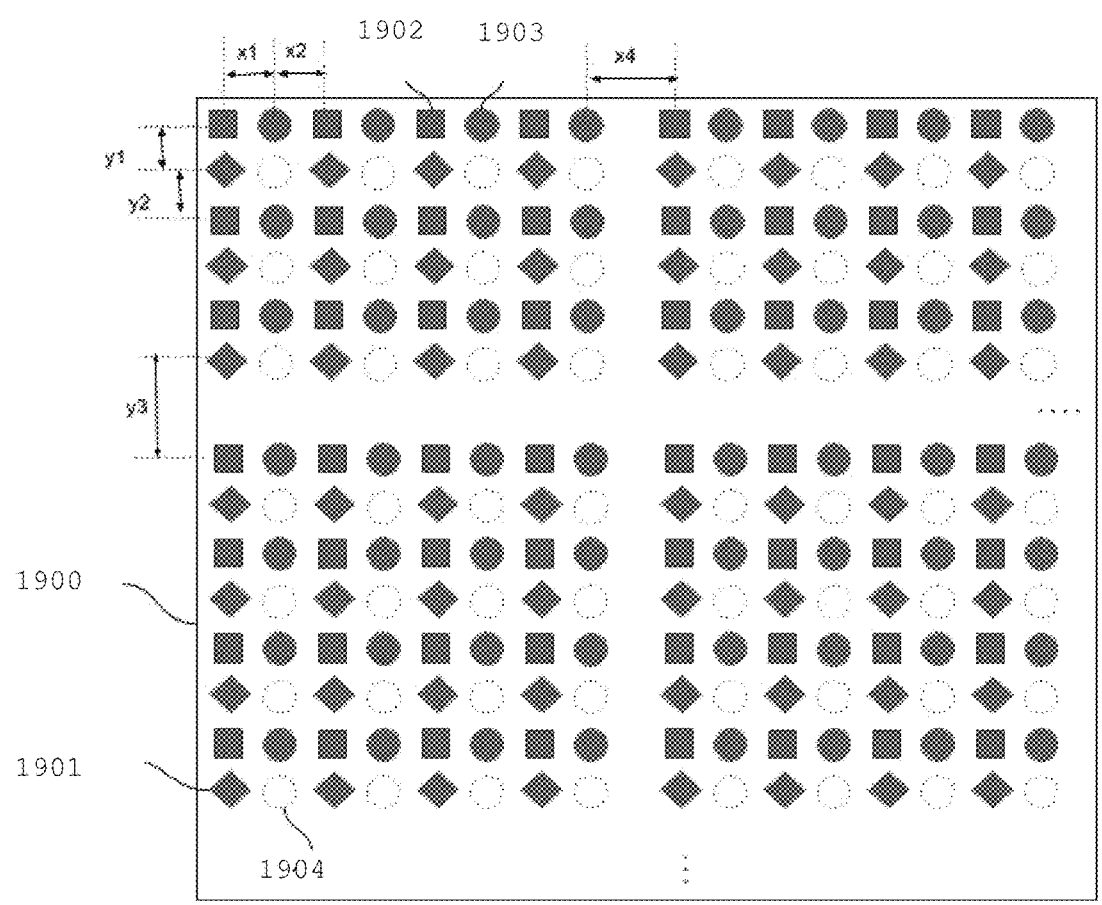
FIG. 16 illustrates an example of a donor (cartridge) substrate with different types of micro devices.

FIG. 16 illustrates another example of a multi-type microdevice cartridge 1900. The cartridge 1900 includes three different types, e.g. colors, of micro devices 1901, 1902, 1903. The other area 1904 may be spare micro devices or a void area (interfering area). However, any number and variety of different types of device may be possible. The distances between micro devices x1, x2, x3 are related to the pitch of the landing areas in the receiver substrate, e.g. receiver substrate 1200, in FIGS. 12A-12D. After an array or a first set of micro devices, which may be related to the pixel pitch in the receiver substrate, there may be a different lateral and vertical pitch x4, y2, i.e. a void area or interfering area, between laterally and vertically adjacent sets of pixels. This pitch compensates for any mismatch between the pixel pitch and the micro device pitch (landing area pitch), and ensures that micro devices on the donor or cartridge substrate 1900 do not interfere with pads, e.g. the horizontally and vertically adjacent cluster 1240, or existing micro devices on the receiver substrate, e.g. receiver substrate 1200. For example, the void area may be an area defined by at least the distance from one side of an outer pad of the pixel to a far side of the outer pad at the opposite side of the pixel, or at least the distance of N times the pitch of the pads, where N is the number of adjacent (horizontally or vertically) pads in the pixel. The length may be the entire length of the cartridge 1900. During assembly, a plurality of groups of micro devices 1901, 1902 and 1903, which may form a pixel, from each array or set of micro devices, may be mounted on the receiver substrate, e.g. receiver substrate 1200, simultaneously. Then the cartridge 1900 or the receiver substrate, e.g. receiver substrate 1200, or both, are moved relative to the other into alignment with a subsequent plurality of clusters of pads, e.g. cluster 1240, and the mounting process is repeated, until the cartridge 1900 is empty or the receiver substrate is filled. At which point another cartridge 1900 or receiver substrate is introduced.

Figure 17:
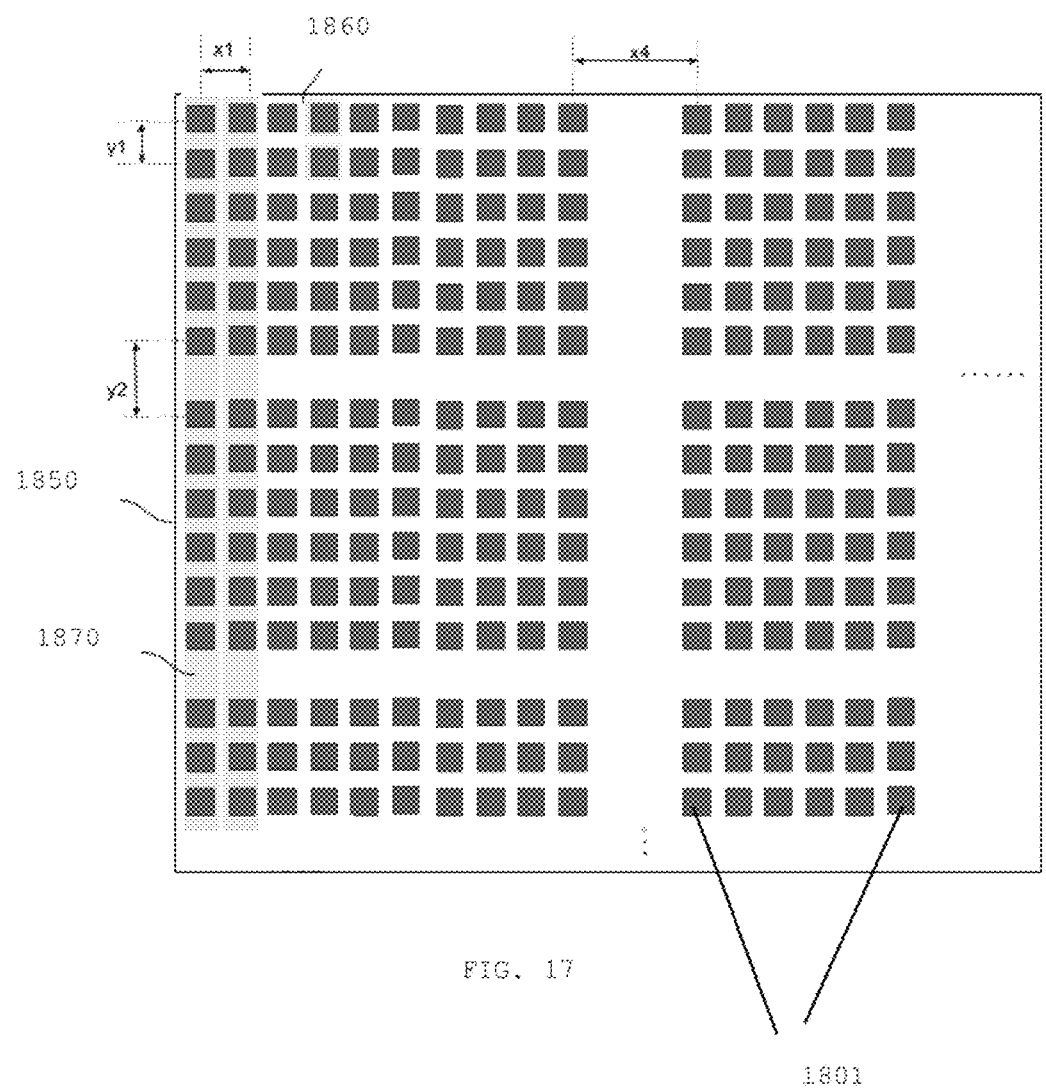
FIG. 17 illustrates an example of a donor substrate for the same type of micro devices, but a different pitch between sets of micro devices.

FIG. 17 illustrates one example of micro devices, e.g. 1801 or 1902, prepared on a donor substrate 1850 before transferring to multi-type micro-device cartridge, e.g. 1800 or 1900. Here, one can use supporting layers 1860, 1870 for individual device or for a group of devices. Here, the micro device pitch x1 can match the pitch in the cartridge 1800 or 1900 or it can be multiple of cartridge pitch. As above the vertical and horizontal array pitch y2 and x4 provide voids or interference areas to prevent interaction of the micro devices 1801 with pads on the receiver substrate or undesired areas on the cartridge 1800 or 1900.

In all the structures above, it is possible to move the micro devices from the first cartridge to a second one prior to using them in populating a substrate. Extra processing step can be done after transfer or some of the processing steps can be divided between first and secondary cartridge structure.

Figure 18:
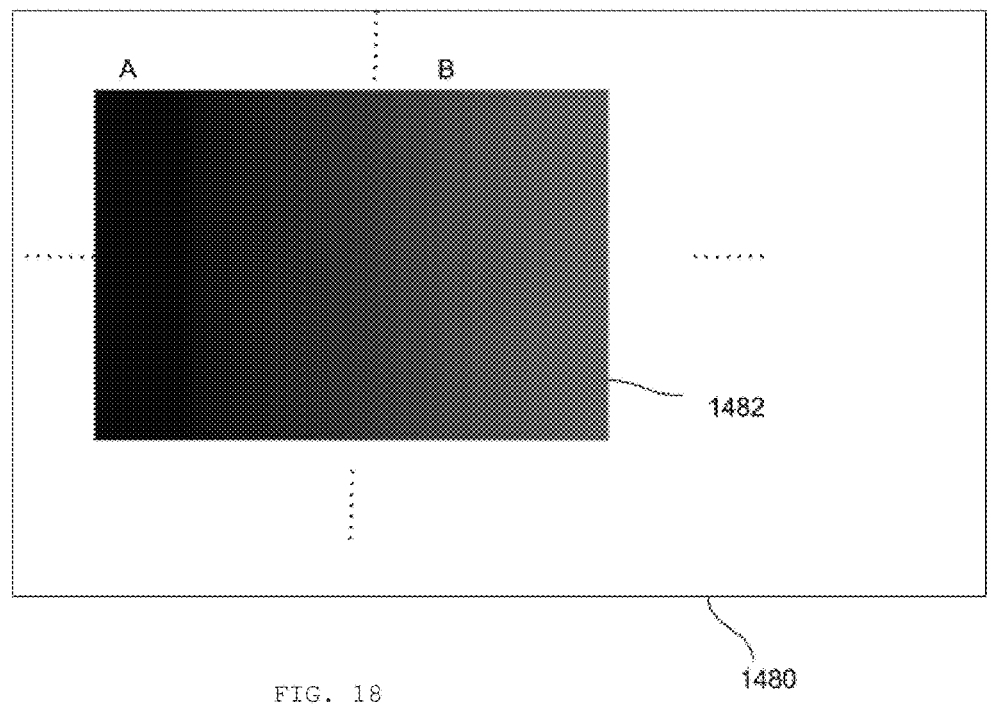
FIG. 18 illustrates an example of a donor substrate with non-uniformity of output across a block of micro devices.
Figure 19:
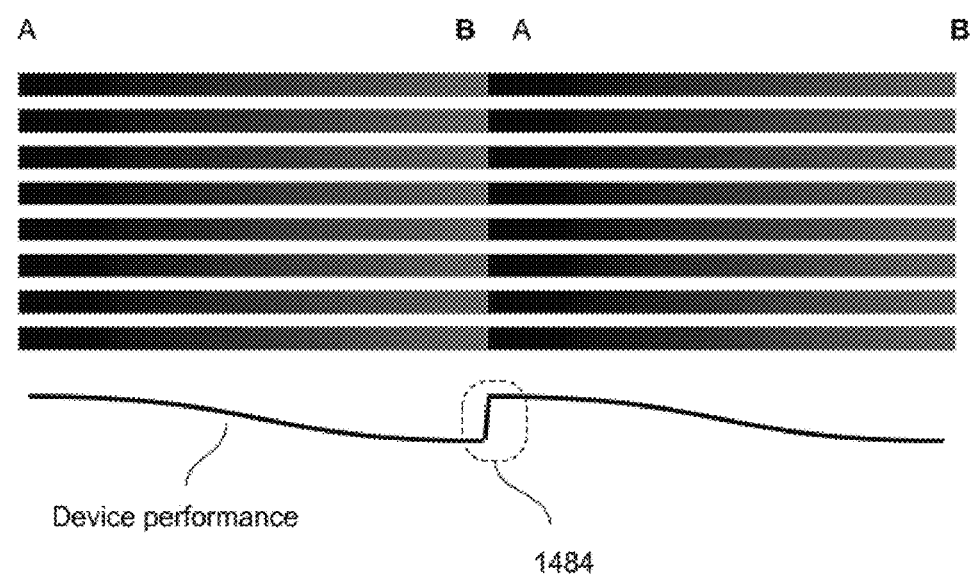
FIG. 19 illustrates an example of a receiver substrate with non-uniformity of output across a plurality of block of micro devices.

FIG. 18 illustrates an example of a block of microdevices 1482 on a donor substrate 1480, which may be any one of the aforementioned donor substrates described herein. As a result of manufacturing and material flaws, the microdevices may have a gradual decrease or increase in output power, i.e. non-uniformity, across the donor substrate, as illustrated with darker to lighter coloring. Since the micro devices may be transferred together in the block 1482 or one or more at a time in sequence into the receiver substrate, the adjacent devices in the receiver substrate gradually degrade in uniformity. However, a worse problem may occur where a series of the blocks 1482 ends and the next series of blocks starts, e.g. along an intersection line 1484, which may result in an abrupt change as demonstrated in FIG. 19. The abrupt change may result in visual artifact for optoelectronic devices, such as displays.

Figure 20:
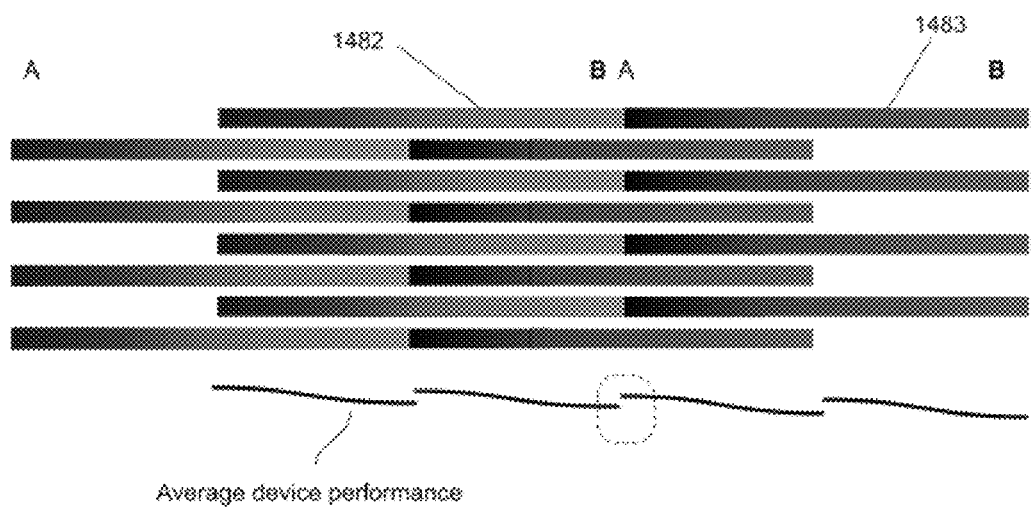
FIG. 20 illustrates an example of a receiver substrate with skewed blocks of micro devices.

In order to solve the problem of non-uniformity, one embodiment, illustrated in FIG. 20, includes skewing or staggering the individual blocks 1482 with the ones below and above them in the display, so that the edge of the blocks are not sharp lines, i.e. eliminating the intersection 1484, and whereby the blocks of devices 1482 form a skewed pattern on the display. Therefore, the average impact of the sharp transition is reduced significantly. The skew may be random and may have different profiles.

Figure 21:
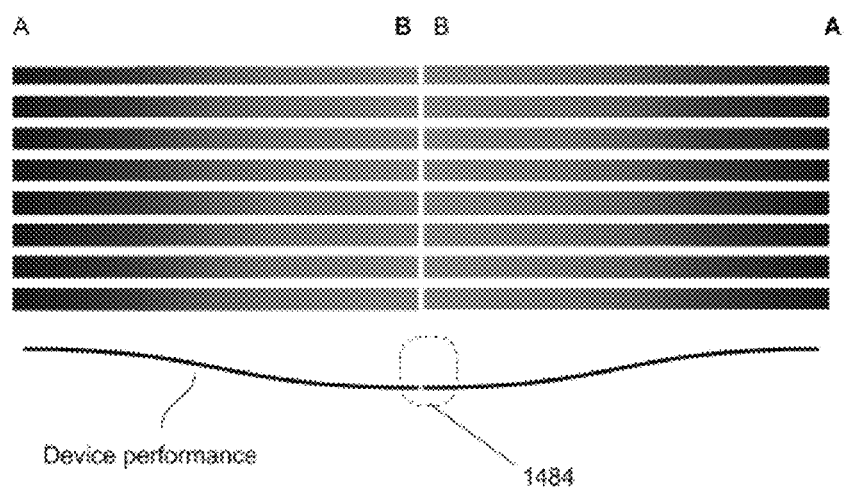
FIG. 21 illustrates an example of a receiver substrate with flipped blocks of micro devices.

FIG. 21 illustrates another embodiment, in which the microdevices in adjacent blocks are flipped so that the devices with similar performance are adjacent one another, e.g. the performance in a first block decrease from a first outer side to a first inner side, while the performance of a second adjacent block increases from a second inner side, adjacent to the first inner side to a second outer side, which may keep the changes very smooth and eliminate the abrupt intersection 1484.

Figure 22:
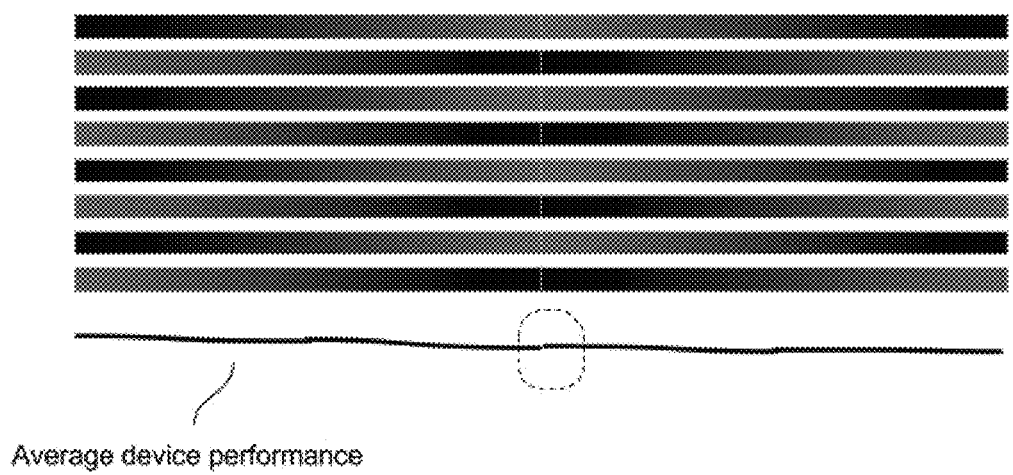
FIG. 22 illustrates an example of a receiver substrate with flipped and alternating blocks of micro devices.

FIG. 22 illustrates an exemplary combination of flipping the devices, alternating the high and low performing devices at the inner sides, and skewing the edges to improve the average uniformity furthermore. In the illustrated example, the device performance alternates between high and low in both directions, i.e. in adjacent horizontal blocks and in adjacent vertical blocks.

In one case, the performance of micro devices at the edges of the blocks are matched for adjacent transferred blocks (array) prior to the transfer to the receiver substrate.

Figure 23:
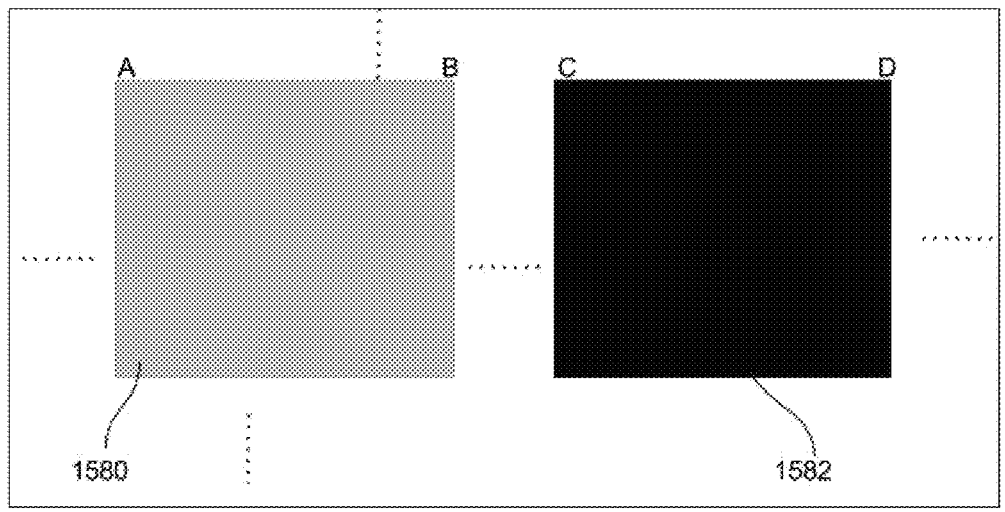
FIG. 23 illustrates an example of a donor substrate with two different blocks of micro devices.
Figure 24:
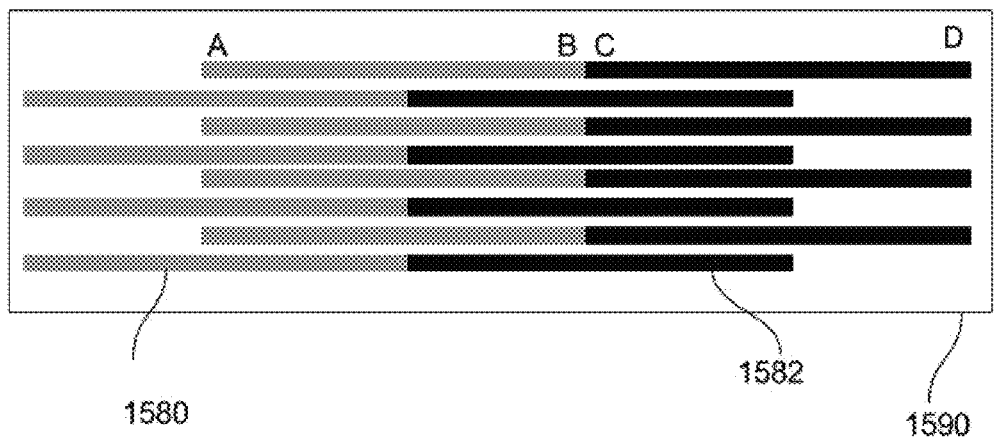
FIG. 24 illustrates an example of a receiver substrate with skewed blocks of different micro devices.

FIG. 23 illustrates using two or more blocks 1580 and 1582, to populate a block in the cartridge or receiver substrate 1590. Here also the method of skewing or flipping can be used for further improving the average uniformity as demonstrated in FIG. 24. Also, a random or predefined pattern may be used to populate the cartridge or receiver substrate 1590 with micro devices from more than one block.

Figure 25A:
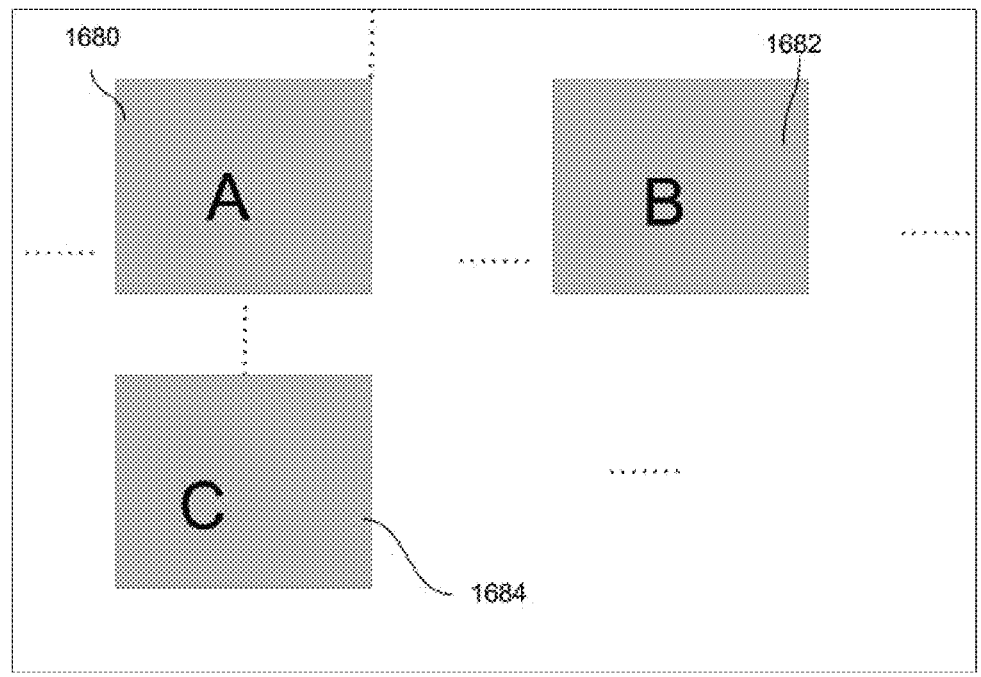
FIG. 25A illustrates an example of a donor substrate with three different types of blocks of micro devices.
Figure 25B:
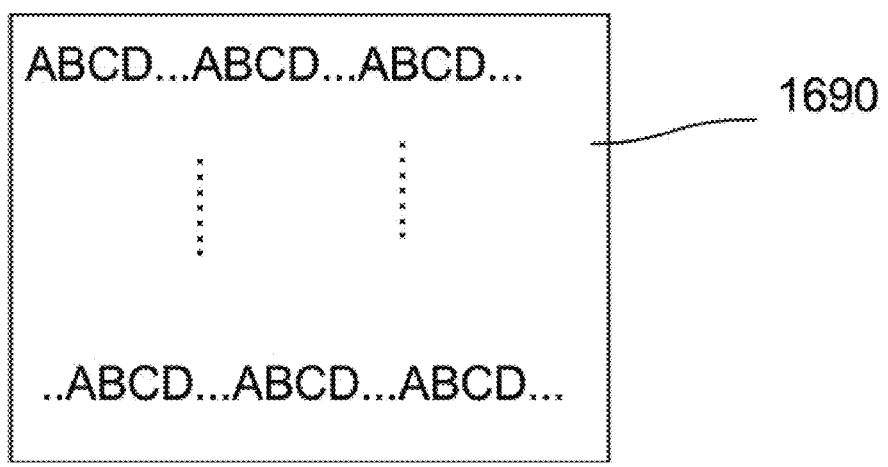
FIG. 25B illustrates an example of populating a cartridge from different blocks to eliminate the non-uniformity found in any one block.

FIG. 25A illustrates samples with more than one blocks 1680, 1682 and 1684, which may be from the same donor substrate or different donor substrates. FIG. 25B illustrates an example of populating a cartridge 1690 from different blocks to eliminate the non-uniformity found in any one block.

Figure 26:
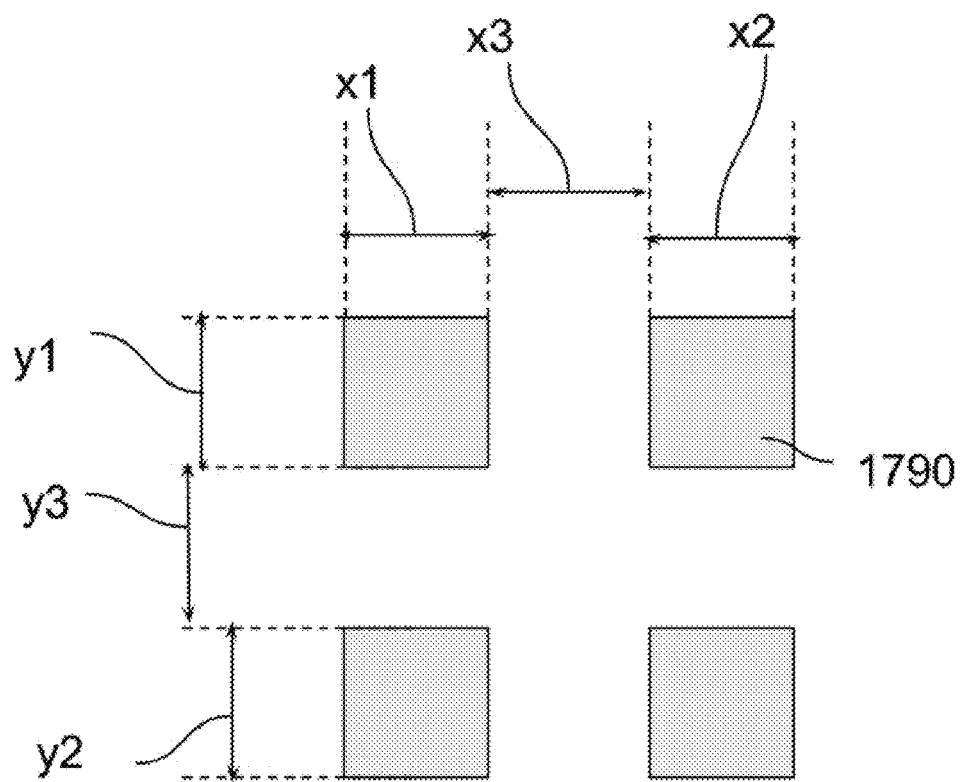
FIG. 26 illustrates an example of a cartridge substrate with a plurality of different types of blocks of micro devices.
Figure 27:
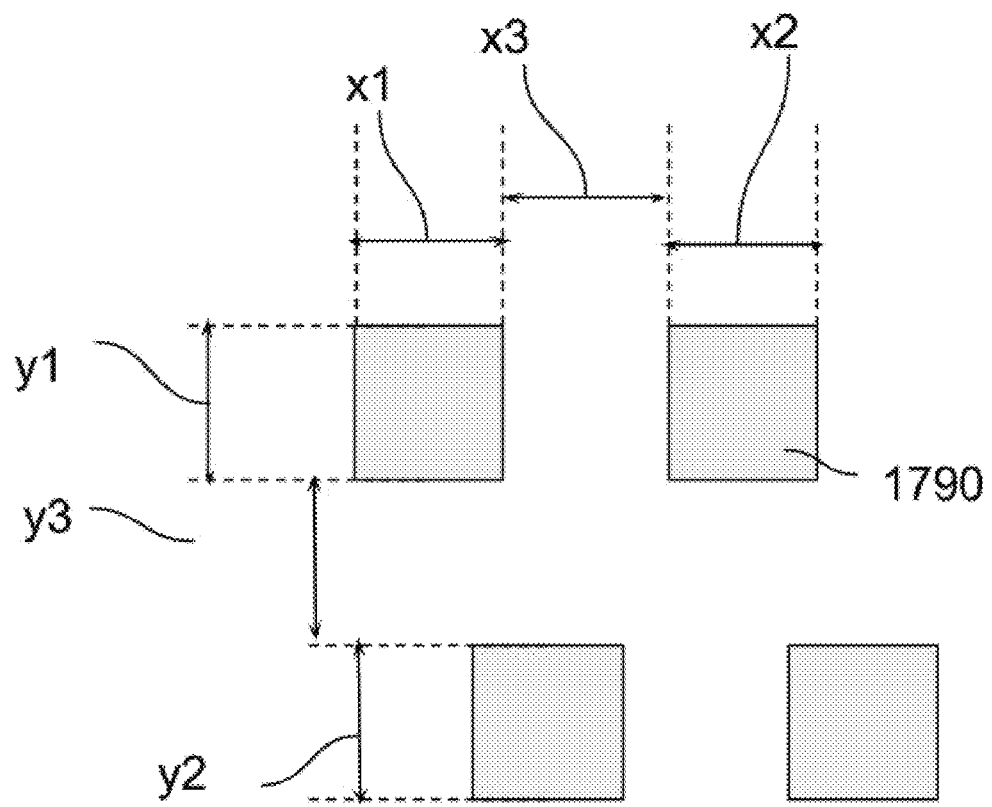
FIG. 27 illustrates an example of a cartridge substrate with a plurality of different types of offset blocks of micro devices.

FIGS. 26 and 27 illustrate structures with multiple cartridges 1790. The position of the cartridges 1790 are chosen in a way to eliminate overlapping the same area in the receiver substrate with cartridges with the same micro-devices during different transfer cycles. In one case, the cartridge may be independent of the other cartridges, which means separate arms or controller is handling each cartridge independently. In another case, the alignment may be done independently, but the other actions can be synchronized. In this case, the substrate may move to facilitate the transfer after the alignment. In another case, the cartridges may move together to facilitate the transfer after the alignment. In another case, both may move to facilitate the transfer. In another case, the cartridges may be assembled in advanced. In this case, a frame or substrate can hold the assembled cartridges. The distance X3, Y3 between cartridges 1790 can be a multiple of the width X1, X2 or length Y1, Y2 of the cartridge 1790. It can be a function of moving steps to different direction. For example, X3=KX1+HX2, where K is the movement step to left (directly or indirectly) and H is the movement steps to the right (directly or indirectly) for populating a substrate. The same can be used for distance between cartridges Y3 and the length of Y1 and Y2. As shown in FIG. 26, the cartridges may be aligned in one or two direction. In another case, shown in FIG. 27, the cartridges may not be aligned in at least one direction. Each cartridge 1790 may have independent control for applying pressure and temperature toward the substrate. Other arrangements are also possible depending on the direction of movement between substrate and cartridges.

In another case, the cartridges 1790 may have different devices and therefore populating different areas in the receiver substrate with different devices. In this case, the relative position of the cartridges 1790 and the receiver substrate changes after each transfer cycle to populate a different area with all the required micro devices from the different cartridges.

In another case, several arrays of cartridges 1790 are prepared. Here, after devices are transferred to the receiver substrate from a first array of cartridges, the receiver substrate is moved to the next array of micro devices to fill the remaining areas in the receiver substrate or receive different devices.

In another case, the cartridges 1790 may be on a curve surface and therefore circular movement provides contact for transferring the micro devices into the substrate.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A method of populating a receiver substrate, comprising:
   a) providing the receiver substrate that includes a plurality of pixels, each pixel including first pads for receiving a first type of micro devices, second pads for receiving a second type of micro devices, and third pads for receiving a third type of micro devices;
   b) providing a first donor substrate that includes a plurality of the first type of micro devices arranged in arrays separated by first interfering areas void of the first type of micro devices;
   c) aligning a first group of the first type of micro devices on the first donor substrate with a first group of the first pads on the receiver substrate, whereby the first interfering areas of the first donor substrate overlap the second pads preventing interference with the second pads by the first type of micro devices;
   d) transferring the first group of the first type of micro devices from the first donor substrate to the first group of the first pads of the receiver substrate;
   e) adjusting a relative position of the first donor substrate and the receiver substrate to align a second group of the first type of micro devices with a second group of the first pads on the receiver substrate, whereby the first interfering areas of the first donor substrate overlap the second pads preventing interference with the second pads by the first type of micro devices; and
   f) transferring the second group of the first type of micro devices from the first donor substrate to the second group of the first pads of the receiver substrate,
   wherein each of the first, second and third pads are arranged in a cluster, whereby a pitch of the first to the third pads within the cluster is smaller than a pitch between the third to the first pads of adjacent clusters in adjacent pixels.

2. The method according to claim 1, further comprising
   g) providing the second donor substrate including the second type of micro devices arranged in arrays of the second type of micro devices separated by second interfering areas void of the second type of micro devices;
   h) aligning second type of micro devices on the second donor substrate with second pads on the receiver substrate, whereby the second interfering areas of the second donor substrate overlap the first pads preventing interference with the first pads by the second type of micro devices; and
   i) transferring the second type of micro devices from the second donor substrate to the second pads of the receiver substrate.

3. The method according to claim 2, wherein each pixel on the receiver substrate also includes the third pads, whereby the first interfering areas of the first donor substrate also overlap the third pads to prevent interference with the third pads by the first type of micro devices, and whereby the second interfering areas of the second donor substrate also overlap the third pads to prevent interference with the third pads by the second type of micro devices; and wherein the method further comprises:
j) providing the third donor substrate including third type of micro devices arranged in arrays of the third type of micro devices separated by third interfering areas void of the third type of micro devices;
k) aligning third type of micro devices on the third donor substrate with third pads on the receiver substrate, whereby the third interfering areas of the third donor substrate overlap the first and second pads preventing interference with the first and second pads with third type of micro devices; and
l) transferring the third type of micro devices from the third donor substrate to the third pads of the receiver substrate.

4. The method according to claim 1, wherein the cluster comprise a linear cluster with the second pad in between the first and third pads;
wherein the first interfering area comprises a width of at least a combined width of the second and third pads, and a length of the first donor substrate; and
wherein each array of first micro devices comprises at least three columns of spaced apart micro device.

5. The method according to claim 4, wherein the second interfering area comprises a width of at least a width of the first pad, and a length of the second donor substrate; and
wherein each array of second micro devices comprises a single column of micro devices.

6. The method according to claim 4, wherein the first micro devices on the first donor substrate has a pitch that is smaller than a pitch of the first, second and third pads on the receiver substrate.

7. The method according to claim 1, wherein the cluster comprises a two dimensional cluster with the second pad laterally offset from the first pad, and the third pad laterally and vertically offset from the first pad; and wherein the first interfering area comprises a width of at least a width of the second pad, and a length of the first donor substrate; and wherein each array of first micro devices comprises at least three columns of spaced apart micro device.

8. The method according to claim 7, wherein the second interfering area comprises a width of at length of a width of the first pad, and a width of the second donor substrate; and
wherein each array of second micro devices comprises at least three rows of micro devices.

9. The method according to claim 8, wherein the third interfering area comprises a width of at least a width of the first pad, and a length extending diagonally across the third donor substrate; and
wherein each array of third micro devices comprises a plurality of columns of micro devices extending diagonally across the third donor substrate.

10. The method according to claim 1, further comprising:
providing another receiver substrate including a plurality of pixels, each pixel including another set of first and second pads;
aligning first micro devices on the first donor substrate with the other set of first pads on the other receiver substrate, whereby the first interfering areas of the first donor substrate overlap the second pads preventing interference with the second pads by the first micro devices;
transferring the first micro devices from the first donor substrate to the first pads of the other receiver substrate;
aligning second micro devices on the second donor substrate with the other set of second pads on the other receiver substrate, whereby the second interfering areas of the second donor substrate overlap the other set of first pads preventing interference with the other set of first pads by the second micro devices; and
transferring the second micro devices from the second donor substrate to the other set of second pads of the other receiver substrate.

11. The method according to claim 10, wherein the step of aligning the first micro devices on the first donor substrate with the other set of first pads on the other receiver substrate includes longitudinally or laterally shifting the first donor substrate by a distance equal to a pitch of the micro devices in the array of first micro devices.

12. The method according to claim 1, further comprising:
repeating steps e) and f) for all of the micro devices on the donor substrate;
repeating steps a) to f) for a plurality of additional donor substrates;
wherein rows of the micro devices gradually decrease in performance from a high side to a low side;
wherein the rows of the micro devices from each donor substrate are placed in a skewed arrangement on the receiver substrate to reduce the effect of abrupt transitions caused by non-uniformity of micro devices across each donor substrate.

13. The method according to claim 1, further comprising:
repeating steps e) and f) for all of the micro devices on the donor substrate;
repeating steps a) to f) for a plurality of additional donor substrates;
wherein rows of the micro devices gradually decrease in performance from a high side to a low side;
wherein laterally adjacent rows of the micro devices from different donor substrates are placed in a flipped arrangement on the receiver substrate with the high or low side of a row from one of the donor substrates adjacent to a high side or low side, respectively, of an adjacent row of another donor substrate to reduce abrupt transitions caused by non-uniformity of micro devices across each donor substrate.

14. The method according to claim 13, wherein vertically adjacent rows of micro devices from different donor substrates are placed in an alternating arrangement with high sides vertically adjacent to low sides to reduce abrupt transitions caused by non-uniformity of micro devices across each donor substrate.

* * * * *